(12) United States Patent
Huse et al.

(10) Patent No.: US 6,521,994 B1
(45) Date of Patent: Feb. 18, 2003

(54) MULTI-CHIP MODULE HAVING CONTENT ADDRESSABLE MEMORY

(75) Inventors: Charles C. Huse, Los Altos, CA (US); William G. Nurge, Union City, CA (US); Varadarajan Srinivasan, Los Altos Hills, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 09/815,232

(22) Filed: Mar. 22, 2001

(51) Int. Cl.[7] .............................................. H01L 23/34
(52) U.S. Cl. ....................... 257/724; 257/723
(58) Field of Search ............................... 257/777, 686, 257/685, 778, 723, 724

(56) References Cited

U.S. PATENT DOCUMENTS

| | | | |
|---|---|---|---|
| 4,062,001 A | * | 12/1977 | Baker |
| 4,074,239 A | * | 2/1978 | Baker |
| 5,311,462 A | * | 5/1994 | Wells |
| 6,121,646 A | * | 9/2000 | Higushi et al. |
| 6,208,545 B1 | * | 3/2001 | Leedy |
| 6,342,710 B1 | * | 1/2002 | Higuchi et al. |
| 6,373,447 B1 | * | 4/2002 | Rostoker et al. |

FOREIGN PATENT DOCUMENTS

EP  0774758  5/1997  .......... G11C/15/00

OTHER PUBLICATIONS

U.S. patent application No. 09/815,233 filed on Mar. 22, 2001 by Varadarajan Srinivasan.
Patent Abstracts of Japan Publication No. 08273376 entitled "Associative Memory System" and published Nov. 18, 1996.

* cited by examiner

*Primary Examiner*—Sheila V. Clark
(74) *Attorney, Agent, or Firm*—William L Paradice III

(57) ABSTRACT

A monolithic Multi-chip Module (MCM) package includes two or more individual CAM dice mounted on a substrate formed as, for example, a plastic ball grid array (PBGA) package. The substrate includes an interconnect structure to route signals between corresponding pads of the CAM dice and balls of the MCM package. In some embodiments, the footprint of the MCM ball grid array package is identical to the footprint of a similar PBGA package housing a single CAM die. Each CAM die within the MCM package may be assigned the same device identification number (DID).

70 Claims, 22 Drawing Sheets

FIG. 6C

| $M_1$ | $M_0$ | MUX Output |
|---|---|---|
| 0 | 0 | DID |
| 0 | 1 | DID + $PA_y$ |
| 1 | 0 | DID + $PA_y$ + $PA_{y+1}$ |
| 1 | 1 | DID + $PA_y$ + $PA_{y+1}$ + $PA_{y+2}$ |

MULTI-CHIP MODULE HAVING CONTENT ADDRESSABLE MEMORY

BACKGROUND

1. Field of Invention

This invention relates generally to content addressable memories and specifically to a Multi-Chip-Module (MCM) system for content addressable memory.

2. Description of Related Art

A content addressable memory (CAM) device is a storage device having an array of memory cells that can be instructed to compare the specific pattern of comparand data with data words stored in corresponding rows of the array. The entire CAM array, or segments thereof, are searched in parallel for a match with the comparand data. If a match exists, the CAM device indicates the match condition by asserting a match flag, and may indicate the existence of multiple matches by asserting a multiple match flag. The CAM device typically includes a priority encoder that provides the highest priority matching address (e.g., the lowest matching CAM index) to a status register. The highest priority matching address, the contents of the matched location, and other status information (e.g., skip bit, empty bit, full flag, as well as match and multiple match flags) may be output from the CAM device to an output bus. In addition, associative data may be read out from an associated addressable storage device (e.g., DRAM).

Due to the rapidly increasing number of addressable sites on the Internet, there is an ongoing desire to increase the storage capacity of CAM devices used for Internet routing applications. This ongoing desire fuels development of future generations of CAM devices that have more storage capacity than previous generations. Each new generation of CAM devices typically has about twice the storage density as previous generation CAM devices.

The ability to be the first to market in offering a next generation CAM device having twice the storage capacity of current generation CAM devices provides a distinct competitive advantage. However, implementing a CAM device in a new process technology to double the storage density requires considerable time and expense, and may be dependent upon others (e.g., wafer manufacturers) to perfect the new process technology. Alternately, creating a new array architecture having twice the storage capacity using current process technology may require considerable time and expense to develop, and may occupy as much as twice the area of the silicon wafer. As a result, the number of manufacturing defects on the wafer that affect the CAM array increases, thereby decreasing manufacturing yield. Further, the increased size of the CAM array may result in the CAM die exceeding present photolithographic stepping dimensions, e.g., the photolithographic stepping fields may be smaller than the individual dice, in which case fabrication using present process technology may not be possible.

Thus, it is desirable to increase the storage capacity of CAM devices without having to develop a new process technology or CAM array architecture.

SUMMARY

A method and apparatus are disclosed that allow for the storage capacity of a CAM device to be significantly increased more easily and more quickly as compared to the prior art. In accordance with the present invention, a monolithic Multi-chip Module (MCM) package includes two or more individual CAM dice mounted on a substrate and encapsulated in, for example, a plastic ball grid array (PBGA) package. The substrate includes an interconnect structure to route signals between corresponding pads of the CAM dice and balls of the MCM package.

For one embodiment, the footprint of the MCM ball grid array package including multiple CAM dice is identical to the footprint of a ball grid array package including a single CAM die. By including a plurality of CAM dice within an MCM package that has the same footprint as a package housing a single CAM die, customers may significantly increase storage capacity by simply replacing the individual CAM die package with an MCM package in accordance with the present invention. Because the footprints are the same, the MCM package may utilize the same socket previously used by the individual die package without altering the system layout or design. Further, because MCM packages of the present invention may be fabricated using current process technologies and proven CAM array architectures, the commercial availability of such MCM packages is not dependent upon development of a next generation process technology or a larger CAM array architecture. As a result, MCM packages in accordance with the present invention may be fabricated and made available to customers long before the next generation CAM device, as traditionally defined, is developed. The ability of present embodiments to provide customers with a monolithic CAM package having significantly increased storage capacity long before others may translate into a significant competitive advantage.

BRIEF DESCRIPTION OF THE DRAWINGS

FIG. 6C shows the signal assignments for one embodiment of the ball grid array of FIG. 6B;

Like reference numerals refer to corresponding parts throughout the drawing figures.

DETAILED DESCRIPTION

Embodiments of the present invention are discussed below in the context of several examples of monolithic multi-chip module (MCM) packages for simplicity only. The interconnections between circuit elements or blocks may be shown as buses or as single signal lines, where each of the buses may alternatively be a single signal line, and each of the single signal lines may alternatively be a bus. Signals or pin names preceded by the symbol "/" are active low. Further, the logic levels assigned to various signals in the description below are arbitrary, and therefore may be modified (e.g., reversed polarity) as desired. Accordingly, the present invention is not to be construed as limited to specific examples described herein but rather includes within its scope all embodiments defined by the appended claims.

Figure 1:
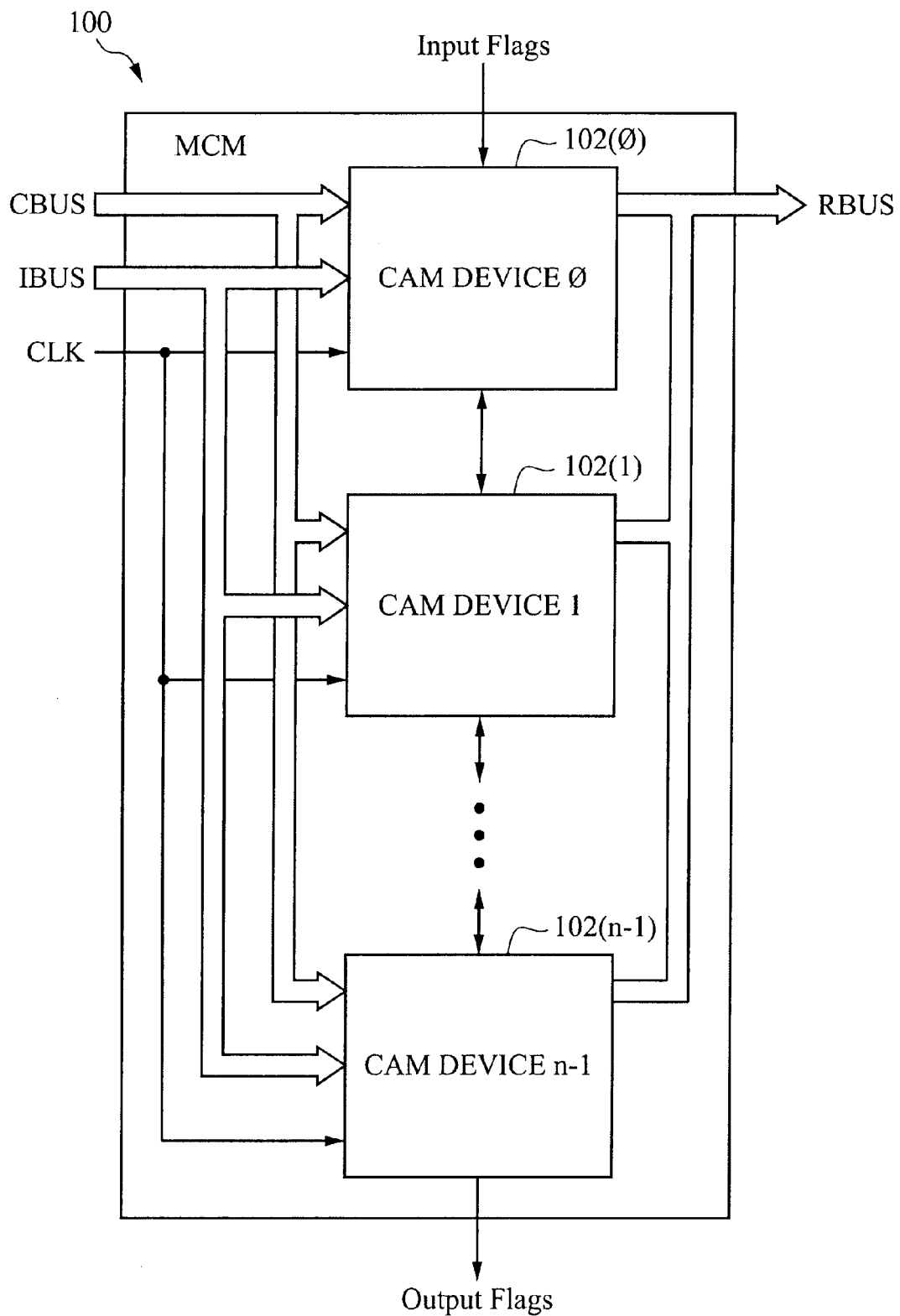
FIG. 1 is a block diagram of an MCM including a plurality of CAM devices in accordance with the present invention.

FIG. 1 shows a monolithic MCM package 100 including a plurality of cascaded CAM devices 102(0)–102(n–1) in accordance with one embodiment of the present invention. Each CAM device 102 includes a CAM array (not shown in FIG. 1 for simplicity) having m rows of CAM cells for storing up to m data words. The total memory capability of MCM 100 is equal to the sum of the array sizes of the CAM devices 102(0)–102(n–1). Thus, for example, if there are n=8 CAM devices 102 and each CAM device 102 includes an m=128 k×64 CAM array, then MCM 100 may operate as a 1M×64 CAM device. CAM devices 102 may be any suitable type of CAM device, including for example, synchronous or asynchronous CAM devices that include binary or ternary CAM arrays. The CAM devices 102 may be any suitable size, and may be of different widths.

For purposes of discussion herein, the first CAM device 102(0) in MCM package 100 is designated as the highest priority device, the second CAM device 102(1) is designated as the next highest priority device, and so on, where the last CAM device 102(n–1) is designated as the lowest priority device, although in alternate embodiments priority may be reversed. In one embodiment where each CAM device 102 includes an array having m rows, the highest priority CAM device 102(0) includes the lowest CAM addresses (i.e., CAM addresses 0 to m–1), the next highest priority device 102(1) includes the next lowest CAM addresses (i.e., CAM addresses m to 2 m–1), and so on, where the lowest priority CAM device 102(n–1) includes the highest CAM addresses (i.e., CAM addresses (n–1)m to nm–1).

MCM package 100 includes a comparand bus CBUS, an instruction bus IBUS, and a results bus RBUS. MCM 100 may receive one or more input flags such as, for example, match flag(s), multiple match flag(s), and full flag(s). These input flags may be used to provide cascade signals between multiple MCM 100s. These and other cascade signals are communicated between the various CAM devices 102 within MCM 100 using bi-directional or unidirectional communication lines. The last CAM device 102(n–1) may provide one or more output flags from MCM 100. Specific cascade interconnections between the CAM devices 102(0)–102(n–1) may differ between the various embodiments, and are therefore not shown in FIG. 1. Indeed, any suitable cascade interconnect architecture may be used to depth cascade CAM devices 102(0)–102(n–1) within MCM 100.

During compare operations, each CAM device 102 of MCM package 100 receives in parallel a clock signal CLK, comparand data from CBUS, and instructions from IBUS. In other embodiments, the comparand bus CBUS and instruction bus IBUS may be the same bus. Other well-known signals which may be provided to the CAM devices 102 on MCM 100, such as enable and reset signals, are not shown for simplicity. In response to the compare operation, CAM devices 102 may output data and/or status information to RBUS. The data output from CAM devices 102 to RBUS may include a matching CAM address and/or data stored in CAMs 102, and the status information may include a match flag, multiple match flag, full flag, skip bit, empty bit, and/or other information. The matching CAM address output on RBUS may be used to retrieve corresponding data from an associated memory (not shown).

Figure 2A:
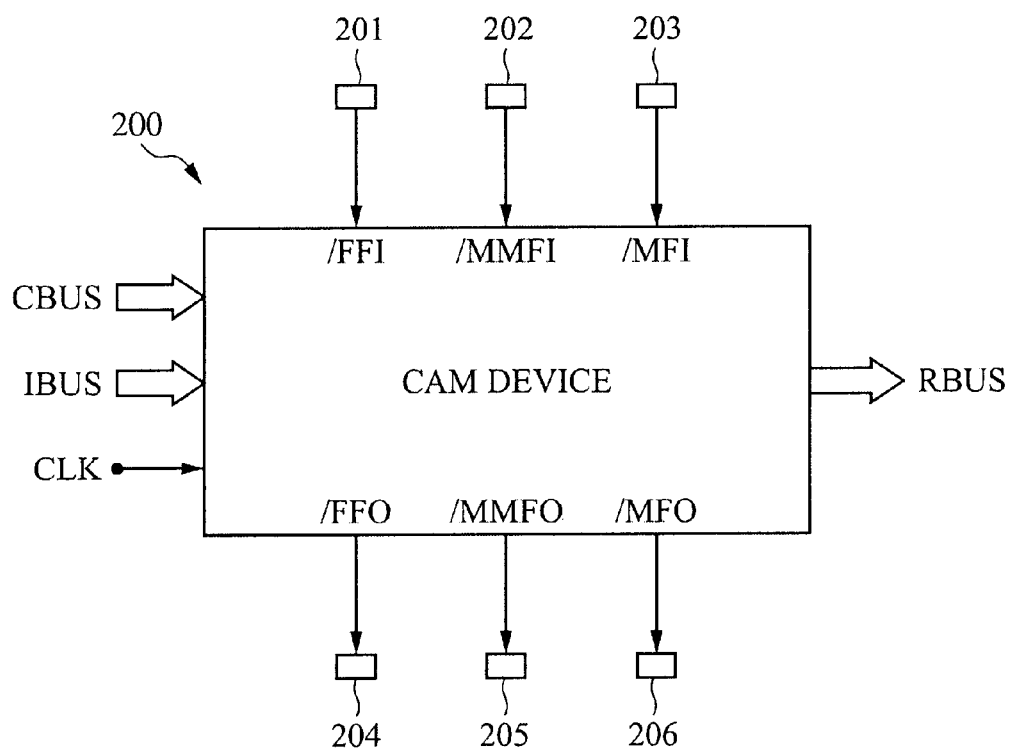
FIG. 2A is a block diagram of a CAM device that may be used in embodiments of FIG. 1.

FIG. 2A shows a well-known CAM device 200 that is one embodiment of CAM device 102. CAM device 200 is fabricated as an integrated circuit (IC) having a plurality of bonding pads 201–206 to receive and provide various cascade signals. Pad 201 is coupled to a full flag input /FFI of CAM device 200, pad 202 is coupled to a multiple match flag input /MMFI of CAM device 200, pad 203 is coupled to a match flag input /MFI of CAM device 200, pad 204 is coupled to a full flag output /FFO of CAM device 200, pad 205 is coupled to a multiple match flag output /MMFO of CAM device 200, and pad 206 is coupled to a match flag output /MFO of CAM device 200. In other embodiments, CAM device 200 may include a plurality of pads 201–203 to receive a plurality of full flag, multiple match flag, and match flag signals. CAM device 200 also includes a number of other bonding pads (not shown in FIG. 2 for simplicity) to interface with CBUS, IBUS, RBUS, CLK, and other signals not shown (e.g., enable and reset signals).

In some embodiments, CAM device 200 may be used as CAM device 102 in MCM package 100. For example, FIG.

3 shows an MCM package 300 that is one embodiment of MCM 100 of FIG. 1. MCM package 300 includes two CAM devices 200(0) and 200(1) interconnected in a depth cascade configuration that has twice the storage capacity of one CAM device 200. CAM devices 200(0) and 200(1) are separate dice mounted on a common substrate 310. The dice may be attached to the substrate using any well-known materials and techniques. Substrate 310, which may be a printed circuit board (PCB) or any other suitable substrate, includes an interconnect structure to route signals between CAM dice 200(0) and 200(1). The CAM dice and substrate are encapsulated or housed, for example, in a plastic ball grid array (PBGA) package. Other package materials may also be used, including ceramic ball grid arrays. Additionally, the MCM package may be formed in pin grid array (PGA) plastic or ceramic technologies.

Figure 3:
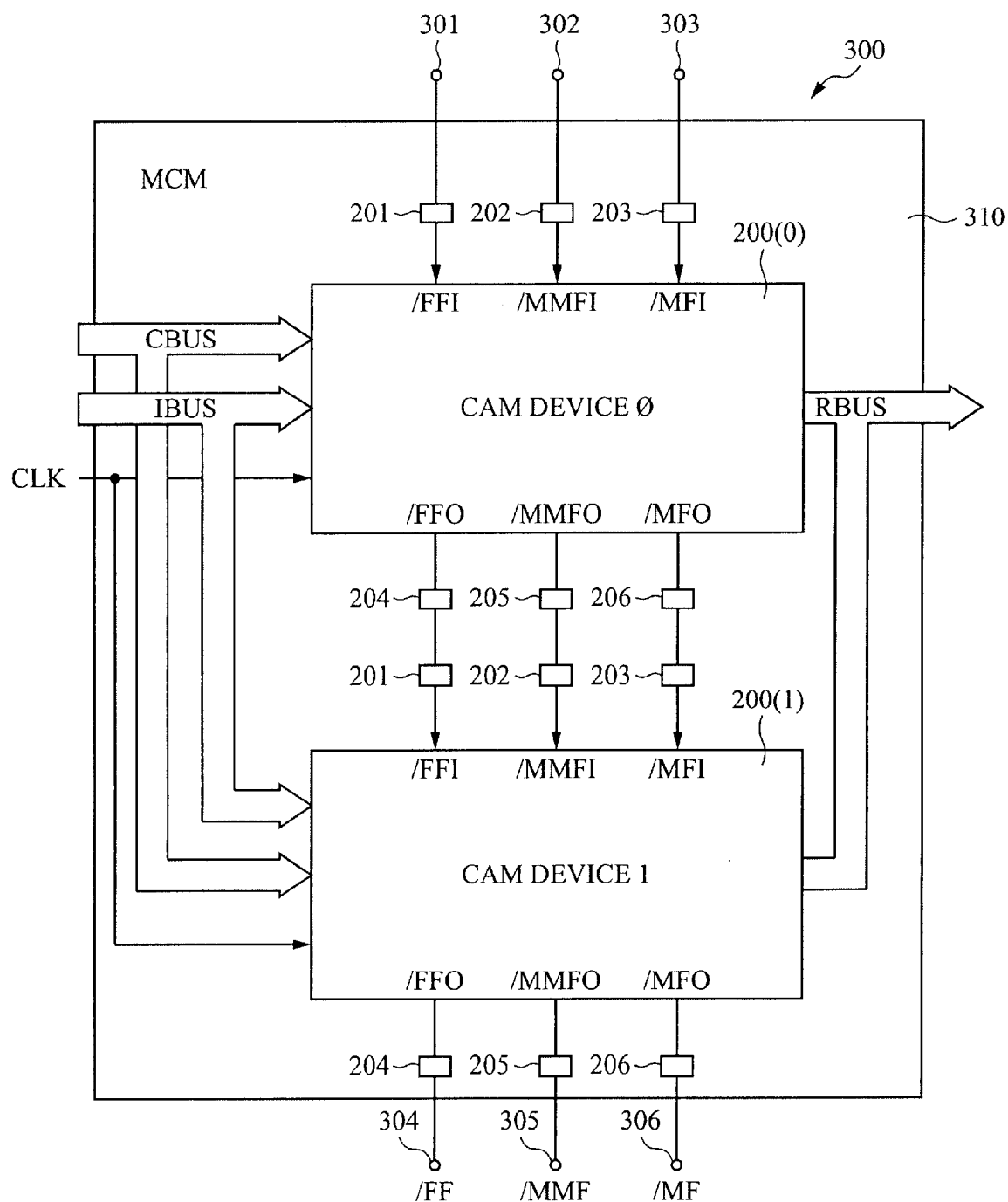
FIG. 3 is a block diagram of one embodiment of the MCM of FIG. 1 having two cascaded CAM devices of FIG. 2A.

The MCM package 300 includes a number of conductive leads to provide electrical connections between MCM package 300 and a host system board or socket. For example, and for purposes of discussion herein, the conductive leads are interconnect balls arranged as a ball grid array (BGA). As illustrated in FIG. 3, MCM package 300 includes interconnect balls 301–306 to receive and provide various cascade signals, as well as a number of other balls (not shown) to interface with CBUS, IBUS, RBUS, CLK, and other signals not shown. In one embodiment, the ball grid array footprint (including ball signal assignment and location) of MCM package 300 is identical to the footprint of a similar type package housing a single CAM device 200 so that customers presently using a single CAM device 200 in their system(s) may easily double storage capacity by substituting MCM 300 for CAM device 200. Advantageously, system boards do not have to be redesigned to accommodate a different package footprint for the denser CAM system.

PBGA package ball 301 and pad 201 of CAM device 200(0) are coupled together to provide an input full flag signal /FFI to CAM device 200(0). PBGA package ball 302 and pad 202 of CAM device 200(0) are coupled together to provide an input multiple match flag signal /MMFI to CAM device 200(0). PBGA package ball 303 and pad 203 of CAM device 200(0) are coupled together to provide an input match flag signal /MFI to CAM device 200(0). In one embodiment, MCM package 300 operates independently of other CAM devices, i.e., MCM 300 is not cascaded to other CAM devices, and ball 301 of MCM package 300 is coupled to a logic "0" (e.g., ground potential) so that the /FFI input to CAM device 200(0) is logic "1", and balls 302–303 of MCM package 300 are coupled to a logic "1" (e.g., power supply $V_{DD}$) so that the /MMFI and /MFI inputs to CAM device 200(0) are logic "1".

Output flags from CAM device 200(0) are provided as corresponding input flags to CAM device 200(1) via bonding pad connections. Specifically, pad 204 of CAM device 200(0) and pad 201 of CAM device 200(1) are coupled together to route the full flag signal therebetween, pad 205 of CAM device 200(0) and pad 202 of CAM device 200(1) are coupled together to route the multiple match flag signal therebetween, and pad 206 of CAM device 200(0) and pad 203 of CAM device 200(1) are coupled together to route the match flag signal therebetween. These interconnections may be formed by conductive traces on substrate 310 that are in electrical connection with bonding pads 201–206 using well-known interconnect techniques.

Ball 304 and pad 204 of CAM device 200(1) are coupled together to provide a full flag signal /FF for MCM 300. PBGA package ball 305 and pad 205 of CAM device 200(1) are coupled together to provide a multiple match flag signal /MMF for MCM 300. PBGA package ball 306 and pad 206 of CAM device 200(1) are coupled together to provide a match flag signal /MF for MCM 300.

Figure 2B:
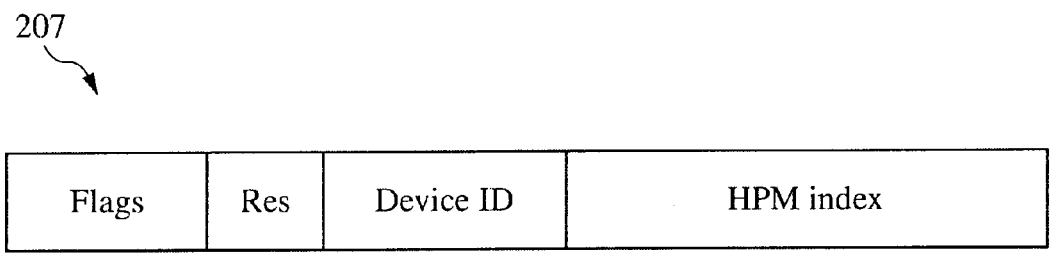
FIG. 2B illustrates a status register used in the CAM device of FIG. 2A.

Upon initialization of MCM package 300, each CAM device 200(0) and 200(1) is assigned a unique device identification number (DID) to allow CAM devices 200(0) and 200(1) to be individually addressed. Thus, for example, CAM device 200(0) may be assigned a DID=0, and CAM device 200(1) may be assigned a DID=1. Referring also to FIG. 2B, each CAM device 200(0) and 200(1) includes a status register 207 to store its unique DID. Status register 207 may include any desirable number of bit locations, and includes a flag field for storing various flags (e.g., full flag, multiple match flag, and match flag), a device ID field for storing the unique DID of the CAM device 200, a highest-priority match (HPM) index field for storing the CAM address or index of the HPM for that device 200, and a reserved field for storing one or more additional reserved bits. In one embodiment, where each CAM device 200 includes m=128 k rows of CAM cells addressable using a 17-bit address, status register 207 may be 32 bits wide, where the flags field is 4 bits wide, the reserved field is 3 bits wide, the device ID field is 8 bits wide, and the HPM field is 17 bits wide.

For one embodiment, the unique DIDs are written sequentially to respective status registers 207 of CAM devices 200(0) and 200(1) using the /FFI and /FFO signals to selectively address the CAM devices. In one embodiment, write device ID instructions provided on IBUS are executed only by the CAM device 200(0) or 200(1) for which /FFI=0 and /FFO=1. Initially, upon power-up of MCM 300, a hardware reset operation is performed to initialize CAM devices 200(0) and 200(1) to a predetermined state, where /FFO of each device 200(0) and 200(1) is set to logic "1" (indicating that CAM devices 200(0) and 200(1) are not full). The logic "1" /FFO of CAM device 200(0) forces /FFI of CAM device 200(1) to logic "1". As mentioned above, the /FFI input to CAM device 200(0) is set to logic "0" via ball 301.

A write device ID instruction is provided on IBUS, and a first DID is provided on CBUS. Because /FFI=0 and /FFO=1 for CAM device 200(0) and /FFI=1 and /FFO=1 for CAM device 200(1), the first DID is written into status register 207 of CAM device 200(0). Then, a set full flag instruction provided on IBUS is executed by CAM device 200(0) to set /FFO of CAM device 200(0) to logic "0", which in turn sets /FFI of CAM device 200(1) to logic "0". A subsequent write device ID instruction is provided on IBUS, and a second DID is provided on CBUS. Now, because /FFI=0 and /FFO=0 for CAM device 200(0) and /FFI=0 and /FFO=1 for CAM device 200(1), CAM device 200(1) executes the write device ID instruction, and the second DID is written into status register 207 of CAM device 200(1).

After CAM devices 200(0) and 200(1) are programmed with the first and second DIDs, respectively, a software reset operation is performed. The software reset operation resets all flag inputs and outputs of CAM devices 200(0) and 200(1) to initial logic states while maintaining the unique DIDs stored in respective status registers 207. Thereafter, CAM devices 200(0) and 200(1) may be individually addressed using their unique DIDs. For example, during compare operations, each CAM device 200(0) and 200(1) generates an HPM index, and then concatenates its unique DID as the most significant bits (MSBs) to the HPM index to form a device index.

By providing two CAM devices 200(0) and 200(1) within an MCM package that has the same footprint as a like package containing a single CAM device 200, MCM embodiments of FIG. 3 allow storage capacity to be doubled by simply substituting MCM package 300 for CAM device 200. Because MCM 300 may be fabricated using current process technologies, the fabrication and subsequent commercial offering of MCM 300 does not depend upon the development and testing of new process technologies. Further, because MCM 300 employs two well-known CAM devices 200, storage capacity may be doubled without developing new and larger CAM arrays. As a result, MCM 300 may be available to customers in far less time than would be required to develop a new process technology or a new and larger CAM array architecture, thereby providing a competitive advantage.

Figure 6A:
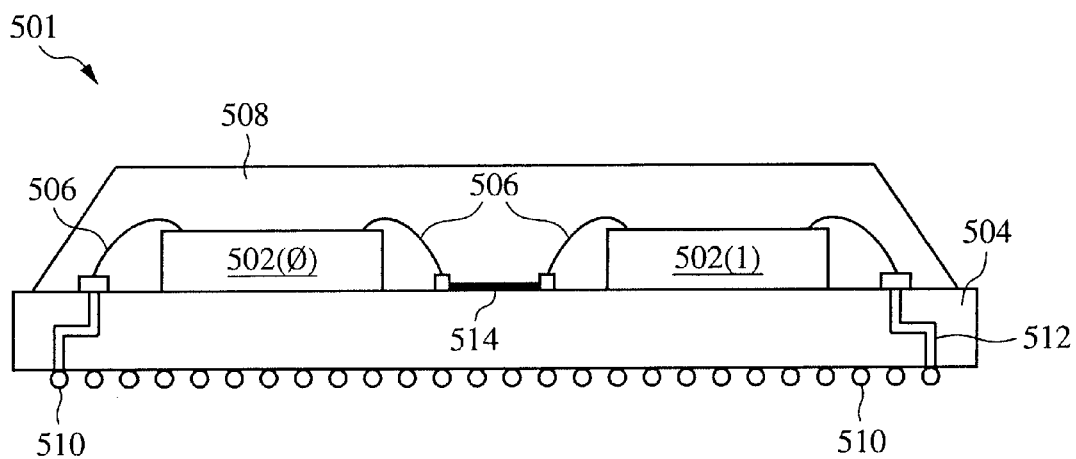
FIG. 6A is a cross-sectional view of one embodiment of the MCM package of FIG. 1 housing two CAM dice.

FIG. 6A is a cross-sectional view of an exemplary PBGA package 501 that is one embodiment of MCM package 300 of FIG. 3. Package 501 includes two CAM dice 502(0) and 502(1) mounted on a package substrate 504. In some embodiments, CAM dice 502(0) and 502(1) are CAM devices 200(0) and 201(1), respectively, of FIG. 3. Signals are transmitted between CAM dice 502(0) and 502(1) via electrical interconnects 506 and 514. Interconnects 506 may be bonding wires or other suitable signal routing interconnects. Interconnects 514 may be conductive traces and/or fingers formed on or in substrate 504. A plurality of balls 510, which may include balls 301–306 described above, are provided on a bottom surface of package substrate 504. Substrate 504 also includes electrical interconnection circuitry 512 (e.g., conductive traces formed on or in substrate 504) to route signals between CAM dice 502(0) and 502(1) and balls 510. A protective insulating layer 508 of, for example, plastic or other well-known insulating materials including ceramic, encapsulates CAM dice 502(0) and 502(1) onto substrate 504.

Figure 6D:
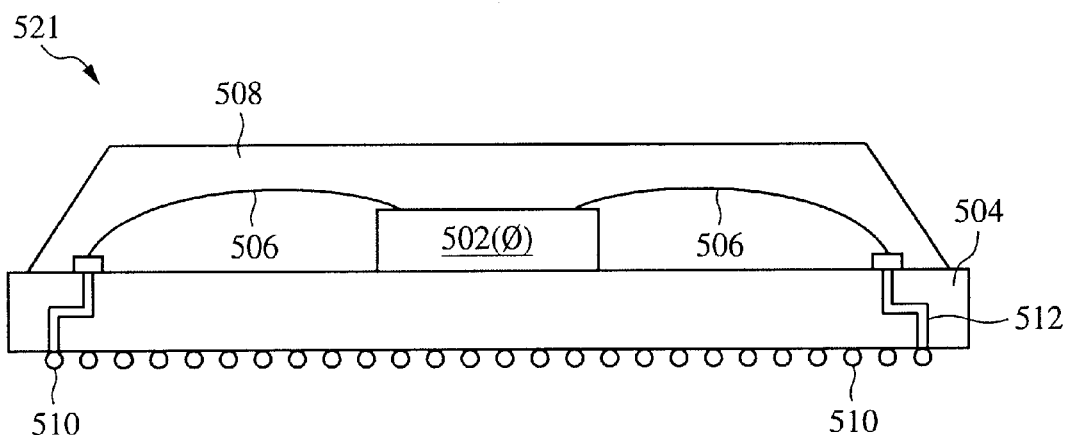
FIG. 6D is a cross-sectional view of a ball grid array package housing a single CAM die.
Figure 6B:
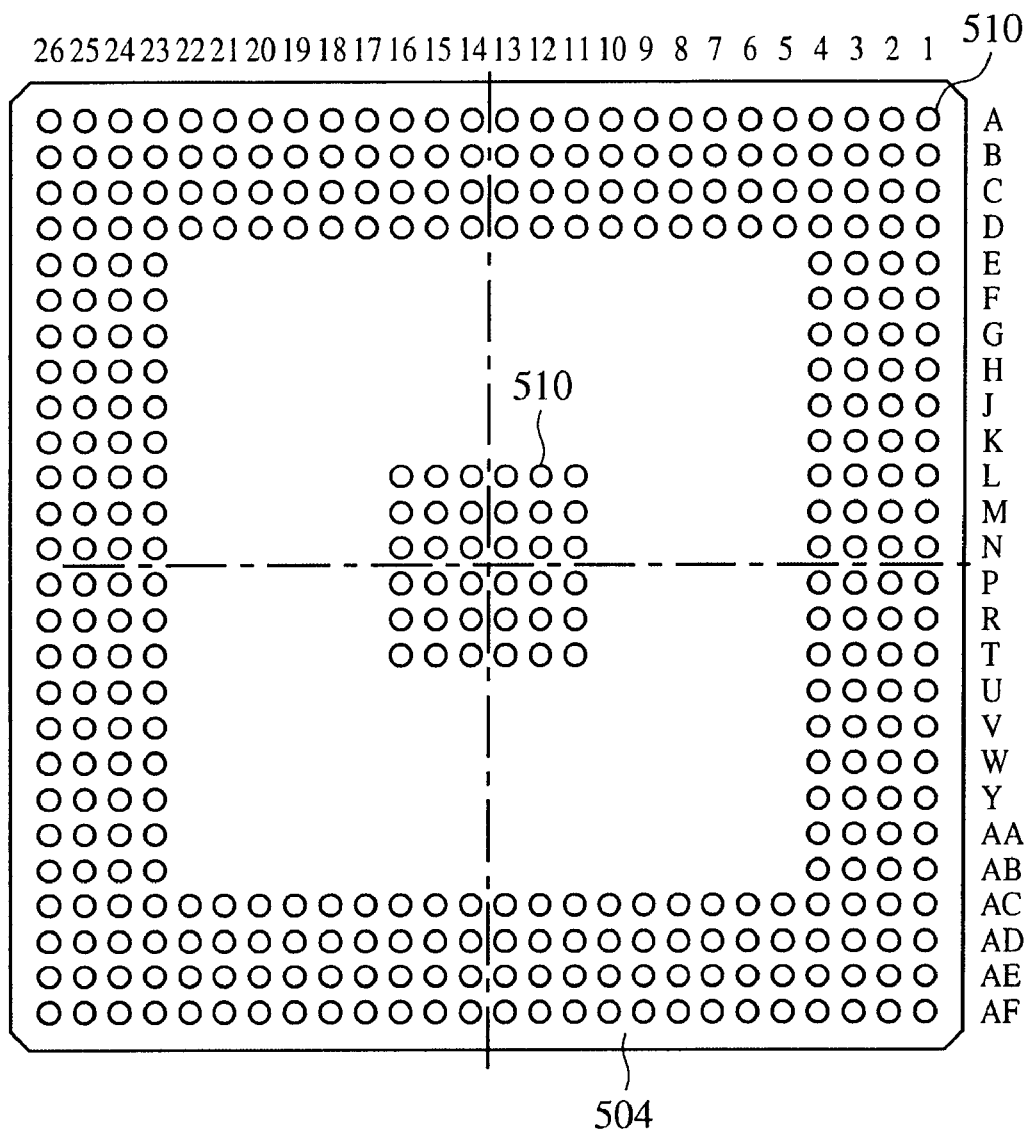
FIG. 6B shows a ball grid array footprint of one embodiment of the MCM of FIG. 1.

FIG. 6B shows a bottom surface of substrate 504 illustrating one embodiment of the ball grid array footprint of MCM package 501. As mentioned above, in some embodiments, the footprint of MCM package 501 is identical to the footprint of a like package housing a single CAM device 200 of FIG. 2A so that customers may increase storage capacity by simply substituting PBGA package 501 that includes multiple CAM devices for the package housing a single CAM device 200.

FIG. 6D is a cross-sectional view of an exemplary PBGA package 521 that includes a single CAM die 502(0) mounted on package substrate 504, where in some embodiments, CAM die 502(0) is CAM device 200 of FIG. 2A. While the footprints of the two packages 501 and 521 may be the same, the substrate dimensions may be the same or different. For one example, a PBGA package containing a single die of CAM device 200 is 35 mm×35 mm, and a PBGA package containing MCM 300 is also 35 mm×35 mm. For another example, a PBGA package containing a single die of CAM device 200 is 37.5 mm×37.5 mm, and a PBGA package containing MCM 300 is 37.5 mm×37.5 mm.

Figure 6C:
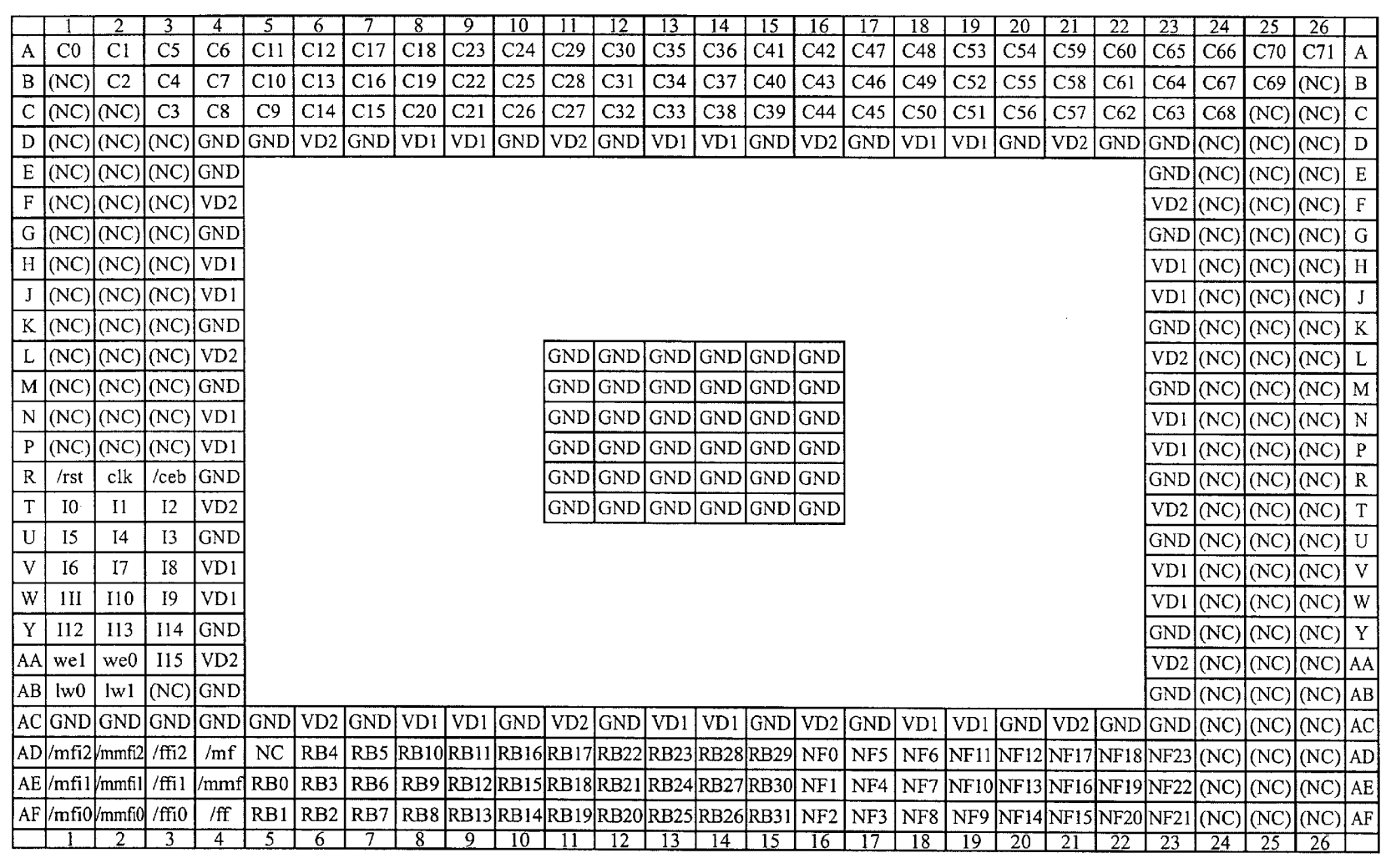

FIG. 6C is a table showing signal assignments for the ball grid array footprint of one embodiment of PBGA package 501 for the NSE3256 network search engine of NetLogic Microsystems, Inc., including two depth cascaded CAM dice having a total storage capacity of approximately 9 Mbits. FIG. 6C is also the same table for the same signal assignments for the ball grid array footprint of an embodiment of a PBGA package for the NSE3128 of NetLogic Microsystems, Inc., housing a single CAM die having a storage capacity of approximately 4.5 Mbits.

Although advantageous in doubling the amount of storage capacity without having to develop a new process technology or a new CAM array architecture, CAM devices 200(0) and 200(1) of MCM 300 are assigned unique DIDs and, therefore, MCM 300 has two associated DIDs. However, it is customary for a monolithic CAM package to have only one DID, and many customers may prefer to associate only one DID per CAM package. As a result, it may be desirable for MCMs in accordance with the present invention to have only one DID.

Figure 4A:
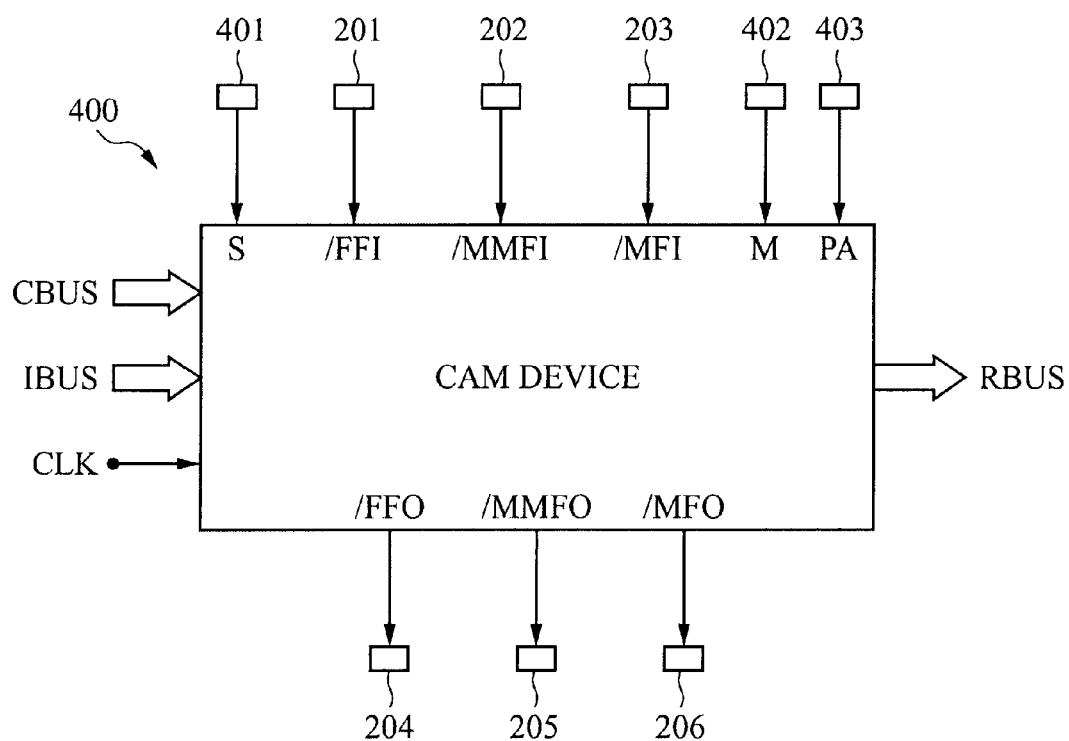
FIG. 4A is a block diagram of a CAM device modified in accordance with one embodiment of the present invention.

Accordingly, in other embodiments, MCM 100 may be assigned only one DID so as to appear and operate as a single CAM package. FIG. 4A shows a CAM device 400 that is another embodiment of CAM device 102 of FIG. 1. CAM device 400 includes a CAM array architecture similar to that of CAM device 200, and is modified in accordance with the present invention to include additional bonding pads 401, 402, and 403 connected to select (S), mode (M), and priority address (PA) inputs, respectively. CAM device 400 includes other portions modified in accordance with the present invention to process the S, M, and PA inputs, as described below with respect to FIGS. 7–11.

The S input of CAM device 400 receives a select signal that may be used to select CAM device 400 during write device ID operations. The M input receives a mode signal that indicates, in one state, that CAM device 400 is configured to operate in a depth cascade configuration with one or more other CAM dice that each have the same DID and, in another state, that CAM device 400 is configured to operate as a single device or in a depth cascade configuration with one or more other CAM devices that each have different DIDs. For one embodiment, the mode signal may indicate whether the CAM die is the only die in a package, or is incorporated into an MCM package in a depth cascade configuration with one or more other CAM dice. For example, and for purposes of the discussion that follows, a logic state of "0" for M indicates that CAM device 400 is a package housing a single die, and a logic state of "1" for M indicates that CAM device 400 is a CAM die operating in a depth cascade configuration as part of MCM 100. The PA input receives a priority address bit that is used to assign priority between CAM devices 400 within MCM package 100. In some embodiments, the mode and priority address signals may be multiple-bit signals.

Figure 4B:
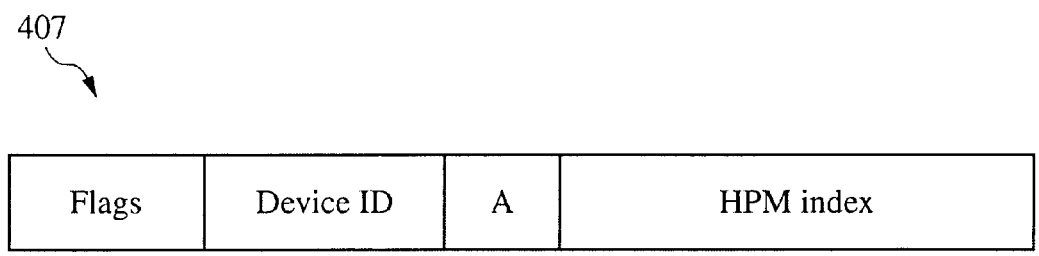
FIG. 4B illustrates a status register used in the CAM device of FIG. 4A.

Referring also to FIG. 4B, the logic state of the PA input is stored as a priority address bit in a status register 407 of CAM device 400. Status register 407 may include any desirable number of bit locations, and in some embodiments includes the same number of bits as status register 207 of CAM device 200. Status register 407 includes a flag field for storing various flags (e.g., full flag, multiple match flag, and match flag), a device ID field for storing a DID, an address field for storing the PA bit, and a highest-priority match (HPM) index field for storing the CAM address or index of the HPM. The PA bit indicates the most significant address bit for the address space formed by the cascaded CAM dice 400(0) and 400(1). The PA bit may be considered as the most significant bit (MSB) of the HPM or, alternatively, as the least significant bit (LSB) of the DID. In one embodiment, where each CAM device 400 includes m=128 k rows of CAM cells addressable using a 17-bit address, status register 407 may be 30 bits wide, where the flags field is 4 bits wide, the DID field is 8 bits wide, the PA field is 1 bit wide, and the HPM field is 17 bits wide.

Figure 5:
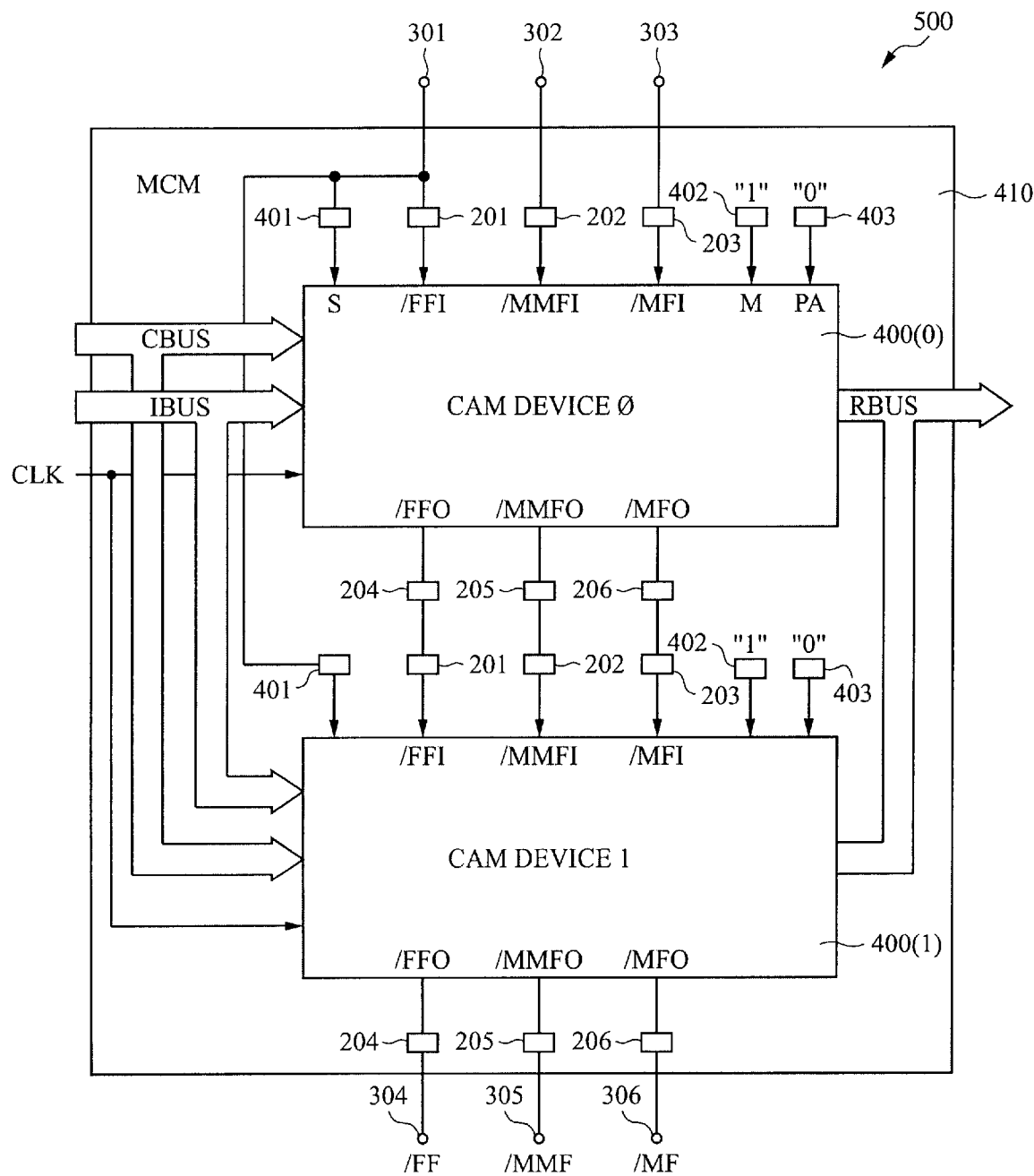
FIG. 5 is a block diagram of another embodiment of the MCM of FIG. 1 having two cascaded CAM devices of FIG. 4A.

FIG. 5 shows an MCM package 500 that is another embodiment of MCM 100 of FIG. 1. MCM or CAM package 500 includes two CAM devices 400(0) and 400(1), and thus has twice the storage capacity of one CAM device 400. CAM devices 400(0) and 400(1) are separate dice mounted on common substrate 410 and housed in, for example, a PBGA package. MCM package 500 includes balls 301—306 to receive and provide various cascade signals, as well as a number of other balls (not shown) to interface with CBUS, IBUS, RBUS, CLK, and other signals, as described above with respect to FIG. 3. When MCM package 500 is not cascaded to any previous CAM devices, ball 301 is coupled to logic "0" and balls 302–303 are coupled to logic "1". In one embodiment, the ball grid array footprint of MCM package 500 is identical to the footprint of MCM package 300, and thus to that of CAM device 200, so that customers presently using a PBGA package housing a single CAM device 200 may easily double storage capacity by substituting MCM 500.

As mentioned above, the M input of each CAM device 400 indicates whether the CAM device is configured to operate as a single device or is configured in a cascade configuration in an MCM package of present embodiments. Thus, in the embodiment shown in FIG. 5, the M inputs of CAM devices 400(0) and 400(1) are set to logic "1" by, for example, hardwiring respective pads 402 to $V_{DD}$ (provided within package 500) to indicate that CAM devices 400(0) and 400(1) are configured to operate as part of MCM package 500.

The PA input of CAM device 400(0) is set to logic "0" by, for example, hardwiring pad 403 of CAM device 400(0) to ground potential (provided within CAM package 500) to set CAM device 400(0) as the higher priority device within package 500 (i.e., the device having the lower addresses). The PA input of CAM device 400(1) is set to logic "1" by, for example, hardwiring pad 403 of CAM device 400(0) to $V_{DD}$ (provided within package 500) to set CAM device 400(1) as the lower priority device within package 500. The hardwired PA input, which is generated within package 500, is used as a priority address bit to distinguish between CAM devices 400(0) and 400(1) during certain operations such as, for example, read operations, write operations, and compare operations. In embodiments where MCM 500 includes more than two CAM devices 400, additional PA inputs may be used to assign priority between the devices.

The S inputs of both CAM devices 400(0) and 400(1) are connected to the /FFI input of CAM device 400(0) by, for example, hardwiring respective pads 401 of CAM devices 400(0) and 400(1) to ball 301 of MCM 500. Because ball 301 of MCM 500 is connected to ground potential (in this example where MCM device 500 is not cascaded with other MCM devices), the select signal S provided to both CAM devices 400(0) and 400(1) is set to logic "0" and, as explained below, may be used to simultaneously write the same DID to both CAM devices 400(0) and 400(1).

The M, S, and PA inputs to CAM devices 400(0) and 400(1) of MCM 500 are each hardwired to a particular logic state or pad provided within MCM 500, and thus do not require additional corresponding dedicated balls 510 of ball grid array 501 to receive externally provided mode signals, select signals, or priority address bits. As a result, the additional pads 401–403 of CAM devices 400(0) and 400(1) are completely internal to MCM 500 and thus invisible or transparent to systems employing MCM 500. By not providing additional balls 510 to provide the M, S, and PA inputs, the footprint of MCM package 500 may be identical to the footprint of CAM die package 200.

For alternate embodiments, the S, M, and PA inputs may also be electrically connected to external pins or balls of MCM 500 to control these signals externally. For other embodiments, the M, S, and PA signals may be programmed into internal registers in the CAM dice.

Figure 7A:
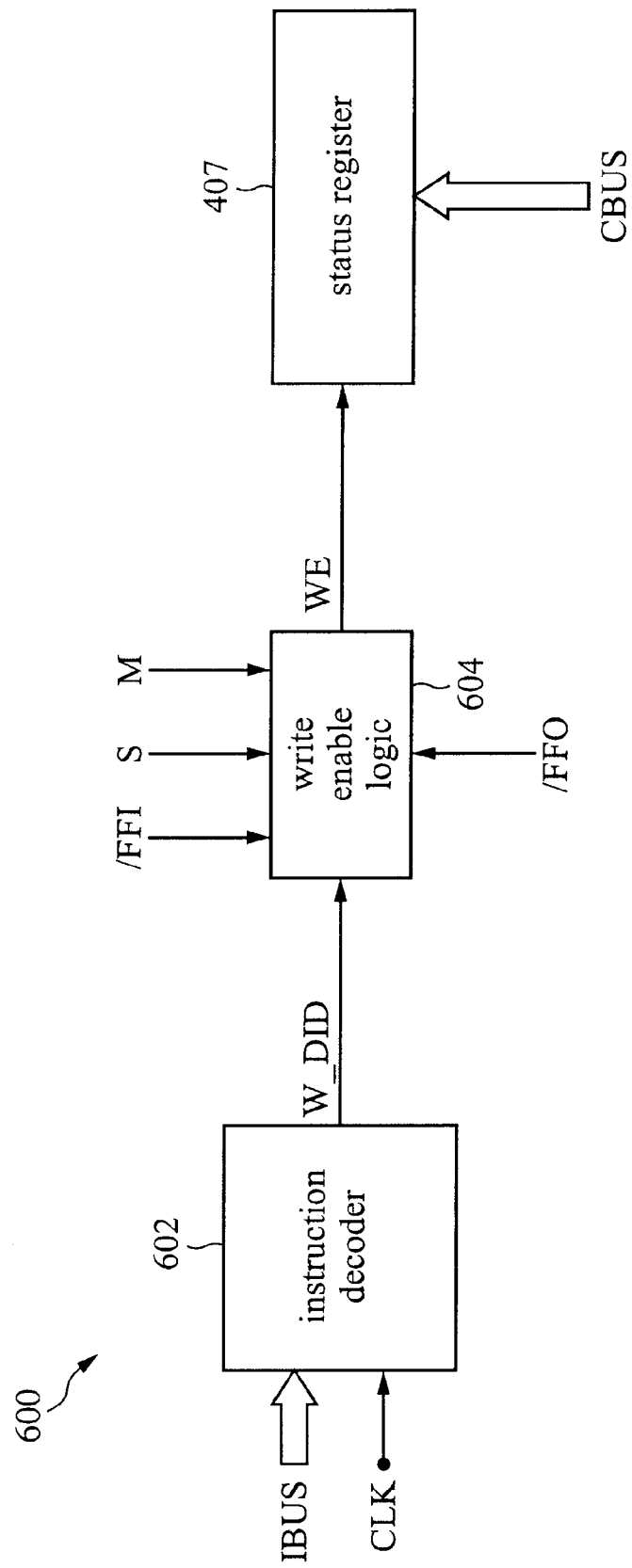
FIG. 7A is a block diagram of a portion of one embodiment of the CAM device of FIG. 4A.

In order for MCM package 500 to appear and operate as a package having a single CAM device, CAM devices 400(0) and 400(1) may be assigned the same DID so that package 500 has only one DID associated therewith. Referring also to FIG. 7A, CAM device 400 includes circuitry 600 that allows a DID to be simultaneously written into respective status registers 407 of both CAM devices 400(0) and 400(1) when configured to operate as part of MCM 500, i.e., when M=1. Circuitry 600 also allows CAM devices 400(0) and 400(1) to be individually addressed for write device ID instructions when configured to operate as independent dice, i.e., when M=0.

Circuitry 600 is shown in FIG. 7A to include an instruction decoder 602, write enable logic 604, and status register 407. Instruction decoder 602 receives instructions from IBUS and receives CLK, and provides a write device ID control signal W_DID to logic 604, which includes input terminals to receive /FFI, /FFO, S, and M inputs. In response to these inputs, logic 604 provides a write enable signal WE to status register 407. Specifically, when M=1, logic 604 asserts WE (e.g., to logic "1") if S=0 and /FFO =1, and when M=0, logic 604 ignores S, and asserts WE if /FFI=0 and /FFO=1. A DID provided on CBUS is written to status register 407 in response to an asserted WE.

Figure 7B:
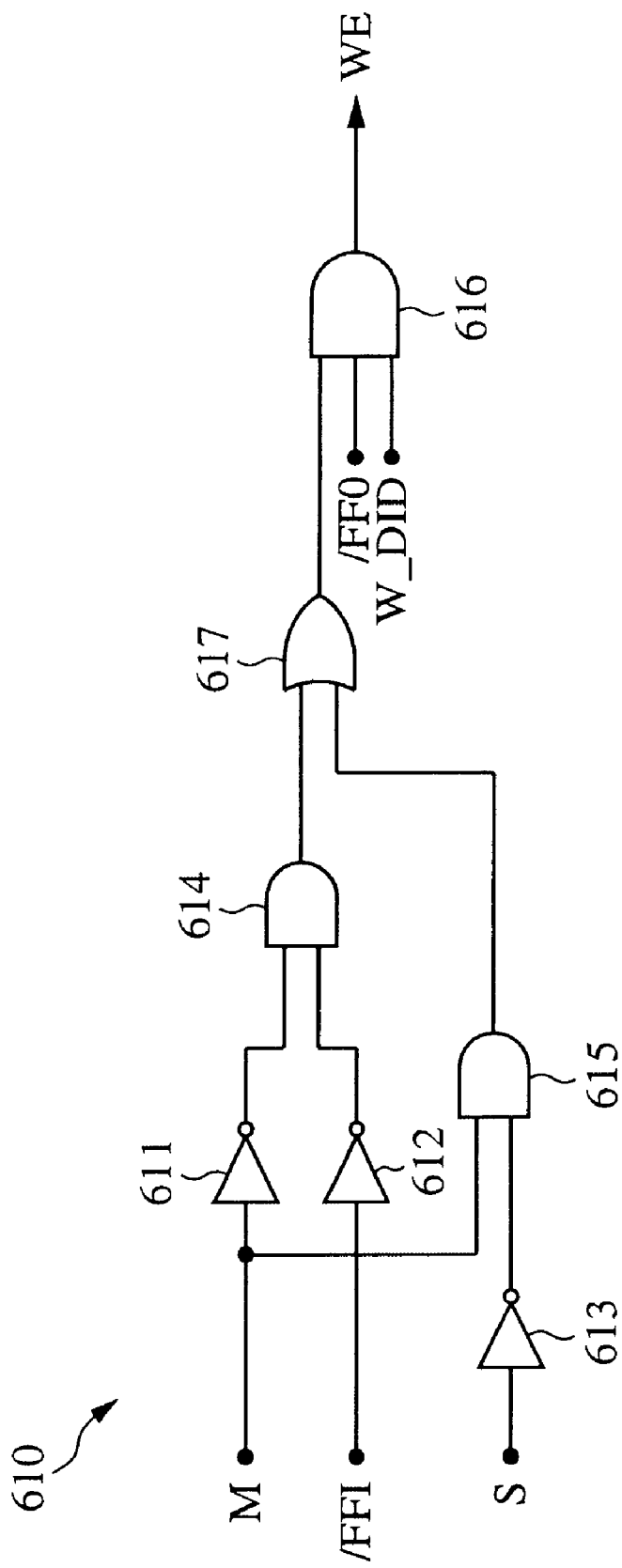
FIG. 7B is a logic diagram of one embodiment of the write enable logic of FIG. 7A.

FIG. 7B shows write enable logic 610 that is one embodiment of write enable logic 604 of FIG. 7A. Write enable logic 610 includes inverters 611–613, AND gates 614–616, and OR gate 617. The M and /FFI signals are logically inverted by inverters 611 and 612, respectively, and provided as inputs to AND gate 614, the output of which is provided as a first input to OR gate 617. The S input is logically inverted by inverter 613 and then logically combined with M in AND gate 615, the output of which is provided as a second input to OR gate 617. The output of OR gate 617 is logically combined with /FFO and W_DID in AND gate 616 to generate WE.

One DID may be simultaneously written to both CAM devices as follows. Initially, upon power-up of MCM 500, a hardware reset operation is performed to initialize CAM devices 400(0) and 400(1) to a predetermined state, where /FFO of each device 400(0) and 400(1) is set to logic "1". M is at logic "1" to indicate that CAM devices 400(0) and 400(1) are part of MCM 500, and /FFI of CAM device 400(0), as well as the S input to each CAM device 400(0) and 400(1), are at logic "0" via ball 301. A write device ID instruction is then provided on IBUS, and a DID is provided on CBUS. Instruction decoder 602 decodes the instruction and asserts W_DID to a logic "1". Because S=0 and /FFO=1 for both CAM devices 400(0) and 400(1), logic 604 in each CAM device 400(0) and 400(1) of MCM 500 asserts WE and, in response thereto, the DID provided on CBUS is written into respective status registers 407 of each CAM device 400(0) and 400(1). After CAM devices 400(0) and 400(1) are programmed with the same DID, a software reset operation is performed to reset flag inputs and outputs of CAM devices 400(0) and 400(1) to initial logic states while maintaining the DID in respective status registers 407. In this manner, MCM 500 has only one DID associated therewith, as may be desired by customers.

In other embodiments in which CAM device 400 operates as a single die in a non-cascade configuration (e.g., in a PBGA package housing a single die), or in which a plurality of cascaded CAM devices 400 may be assigned unique DIDs (using /FFI and /FFO for instance, as described above with respect to CAM devices 200 of MCM 300), the M signal is set to logic "0", which in turn disables the PA and S inputs to the CAM device. When M=0 and W_DID is asserted to logic "1", logic 604 asserts WE so that a DID on CBUS is written to status register 407 of its associated CAM device 400 when /FFI=0 and /FFO =Compare operations of CAM devices 400(0) and 400(1) of MCM 500 are discussed below with respect to FIG. 8. Because each CAM device 400(0) and 400(1) in MCM 500 has the same DID (when M=1) and uses the same address range for its CAM array (i.e., the same address range for the HPM index), the hardwired priority address bits PA provided to respective CAM devices 400(0) and 400(1) are used to distinguish between CAM devices 400(0) and 400(1) during compare operations (and, as discussed below with respect to FIG. 12, during read and write operations also).

Figure 8:
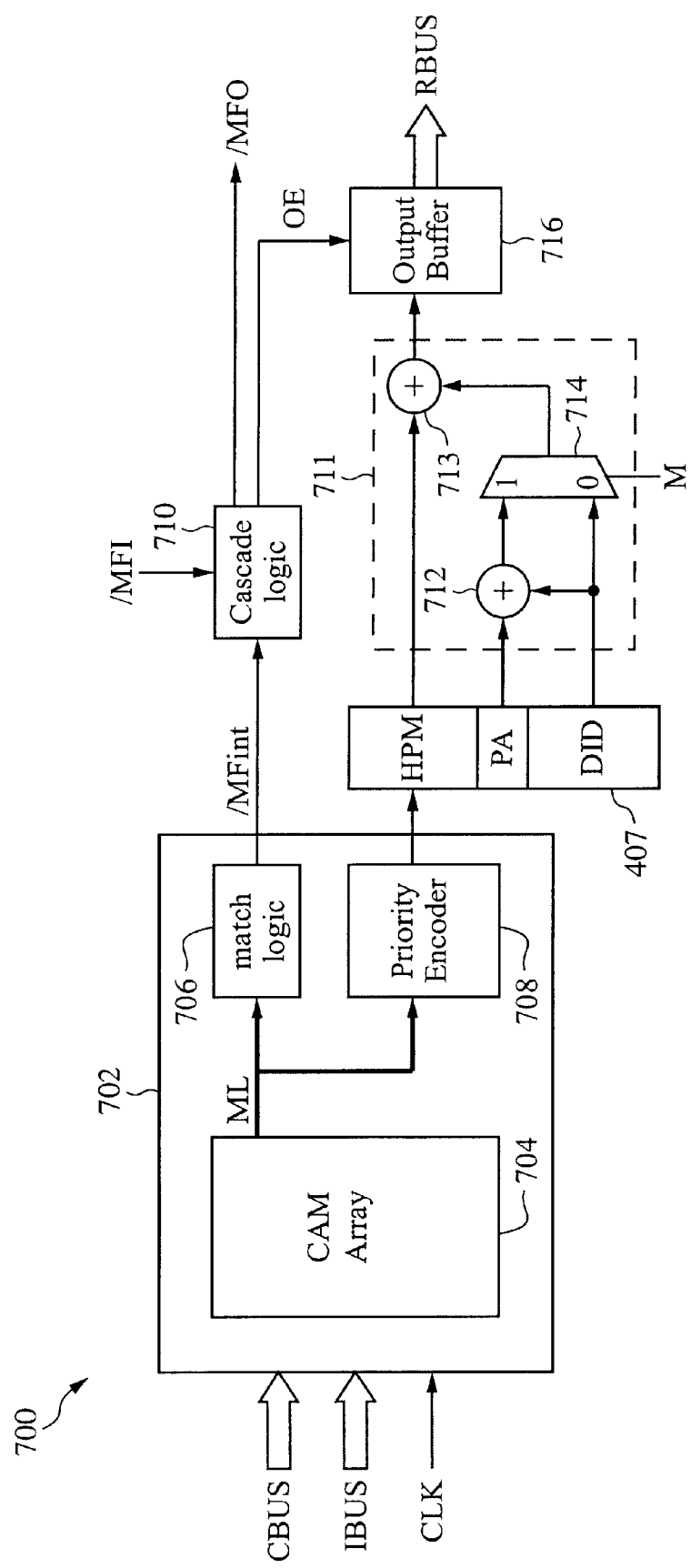
FIG. 8 is a block diagram of another portion of one embodiment of the CAM device of FIG. 4A.

FIG. 8 shows a portion 700 of one embodiment of CAM device 400 of FIG. 4A. CAM portion 700 includes a CAM core 702, a cascade logic circuit 710, concatenation logic 711 including concatenation nodes 712–713 and a multiplexer (MUX) 714, an output buffer 716, and status register 407. In some embodiments, concatenation node 713 may be included within buffer 716. CAM core 702 includes a CAM array 704, match logic 706, and a priority encoder 708. CAM array 704 has a plurality of rows of CAM cells for storing a plurality of CAM words therein. Each row may also include one or more valid bits indicative of whether a valid CAM word is stored in the row. The valid bits may be used in a well-known manner to generate a full flag. Each row of CAM cells is coupled to one of the corresponding match lines (ML) that carries a match signal indicative of match results between comparand data and data stored in a corresponding CAM row. Match logic 706 monitors the match signals, and in response thereto, generates an internal match flag /MF_int. Priority encoder 708 also monitors the match signals, and in response thereto, generates the HPM index, which may be the lowest numbered address, the highest numbered address, or any other selected address. Buffer 716, which may be any suitable buffer, is coupled between status register 407 and RBUS, and includes a control terminal to receive an output enable signal OE from cascade logic circuit 710.

In response to a compare instruction received from IBUS, a comparand word provided on CBUS may be compared with words stored in CAM array 704. If there is a match, /M_int is asserted to logic low to indicate the match condition, and the HPM index is forwarded from priority encoder 708 to status register 407, which as discussed above also stores the hardwired A bit and the DID. If there is not a match, /M_int is de-asserted to logic high to indicate the mismatch condition.

The HPM index is output from status register 407 to concatenation node 713, which has an output coupled to an input of buffer 716. The PA bit and DID are output from status register 407 and concatenated at node 712 and provided to one input of MUX 714. As indicated above, the PA bit is MSB of the HPM index. DID is provided to a second input of MUX 714. MUX 714 also includes a control terminal to receive the mode signal M (e.g., from pad 402) and an output port coupled to concatenation node 713. In response to M, MUX 714 provides either DID or the concatenation of PA and DID to concatenation node 713. The HPM index and the signal provided by MUX 714 are concatenated at node 713 to form the device index, where the HPM index and PA are the LSBs of the device index and DID is the MSBs of the device index. The device index is provided to buffer 716. Corresponding data and/or status information may also be provided to the buffer 716.

Thus, the mode signal M determines whether the hardwired PA bit is inserted between the DID and HPM index to form the device index. For example, if M=1, which indicates that CAM device 400 is configured to operate as part of MCM package 500, MUX 714 outputs the concatenation of PA and DID to node 713, which in turn outputs the concatenation of the HPM index, PA, and DID to form the device index. Because the PA bit and DID are stored in status register 407 during initialization of CAM device 400, and the logic state of M is static (e.g., hardwired to logic "1"), MUX 714 provides the concatenation of PA and DID to node 713 before priority encoder 708 generates the HPM index. Thus, the signal path between status register 407 and buffer 716 via MUX 714 is not a speed critical path.

Conversely, if M=0, which indicates that CAM device 400 is configured to operate as a single CAM die package, MUX 714 outputs DID to node 713, which in turn outputs the concatenation of DID with the HPM index to form the device index.

For an alternate embodiment, MUX 714 may have one input that receives the concatenation of the HPM index and PA and another input that receives just the HPM index. In this embodiment, when M=1, the concatenation of the HPM index and PA is provided to node 713, and when M=0 only the HPM index is provided to node 713. In this embodiment, the DID is provided to node 713 and concatenated with either the HPM index or the HPM index and PA, depending upon the logic state of M, to form the device index.

Cascade logic circuit 710 may be any known cascade logic that combines /M_int from CAM array 704 and match information via /MFI to generate the /MFO and OE signals. /MFO indicates whether there is a match condition in associated CAM array 704 or in any previous CAM device. /MFO is asserted to logic low if (1) there is a match condition in associated CAM array 704, as indicated by M_int, and/or (2) there is a match in a higher-priority CAM device, as indicated by /MFI. If there is not a match in associated CAM array 704 or in any higher-priority CAM device, /MFO is de-asserted to logic high. OE is asserted to logic high to cause buffer 716 to forward the device index and any associated data or status information to RBUS if (1) there is a match in associated CAM array 704 and (2) there is not a match in a higher priority device. Otherwise, OE is de-asserted to logic low to preclude buffer 716 from accessing RBUS. In this manner, OE may be used to ensure that the device index and any associated data or status information of the highest-priority CAM device in MCM 500 is provided to RBUS.

As mentioned above, MCM 100 may include any number of CAM devices. In embodiments employing a number n of CAM devices 400(0)–400(n−1), each CAM device has m addressable rows of CAM cells for a total address space of n×m represented by y=log$_2$m address bits AD[y−1:0] and an additional x=log$_2$n of the PA inputs PA[y+x−1:y] to indicate relative priority between the CAM devices. That is, because all n CAM devices 400 are assigned the same DID, and the CAM arrays within each CAM device use the same index range (e.g., 0 to m−1), the additional x priority address bits PA[y+x−1:y] are used to distinguish CAM devices 400(0)–400(n−1) in generating respective device indices. Thus, for example, if MCM 100 includes n=8 CAM devices 400, then each CAM device uses x=3 of the PA inputs. However, because some MCM embodiments that employ CAM devices having three PA inputs may include between two and eight CAM devices 400, the number of PA bits inserted between the DID and HPM index to form the device index may vary depending upon the number of CAM devices cascaded within MCM 100.

Thus, in some embodiments, concatenation logic 711 of FIG. 8 may be replaced by a multiplexing circuit 800 of FIG.

9 that allows a selected number of PA bits to be used in generating the device index. Multiplexing circuit 800 includes a MUX 802 having x+1 input ports 804(0)–804(x), an output port coupled to concatenation node 713, and a control port to receive the mode signal M. Each input port 804 of MUX 802 receives the DID from status register 407 and a corresponding number of priority address bits PA. For example, the first input port 804(0) receives only the DID, the second input port 804(1) receives the DID plus the LSB of the PA inputs, i.e., (PA[y]), the third input port 804(2) receives the DID plus the 2 LSBs of the PA inputs, i.e., PA[y] and PA[y+1], and so on, where the last input port 804(x) receives the DID plus all of the PA inputs, i.e., PA[y+x−1:y].

In these embodiments, there may be multiple M signals (i.e., w mode signals M[w−1:0] that, in addition to indicating whether CAM devices 400 are configured to operate independently or as part of the MCM, may also indicate the number of CAM devices cascaded within the MCM. In these embodiments, the mode signals may be used to select the number of priority address bits PA that are inserted between the DID and the HPM index to form each device index. The additional mode bits may be provided by selectively hard-wiring additional M input pads of each CAM device 400 to either a logic "0" state or a logic "1" state provided within the package 500.

For one embodiment, w=x, where each CAM device 400 includes three PA inputs (and thus three pads 403) to allow for addressing up to n=8 CAM devices on MCM 100, and the mode signal includes three M input bits to select how many of the three PA bits to insert between the DID and the HPM index to form the device index. Thus, for example, if there are n=8 CAM devices 400 in the MCM, then three PA input bits are used to individually identify the eight CAM devices. For this example, the mode signals are set so that MUX 802 forwards DID+PA[y+2]+PA[y+1]+PA[y] to node 713.

For another example, if there are n=4 CAM devices 400 in the MCM package, then two PA input bits are used to individually identify the four CAM devices. For this example, two mode signals are set so that MUX 802 forwards DID+PA[y+1]+PA[y] to node 713. A truth table illustrating the logic function performed by MUX 802, in one embodiment, for CAM devices 400 having two PA inputs and corresponding two mode signal inputs M0 and M₁ is shown in FIG. 11, where X is a don't care.

For an alternate embodiment, each input port 804 of MUX 802 may receive the HPM index and a corresponding number of the PA bits, and node 713 may receive as inputs the output signal from MUX 802 and the DID. In this embodiment, MUX 802 outputs a concatenation of the HPM and a selected number of the PA bits (depending upon the mode signals M) to node 713, which in turn concatenates the output signal from MUX 802 with DID to form the device index.

Figures 10, 11:
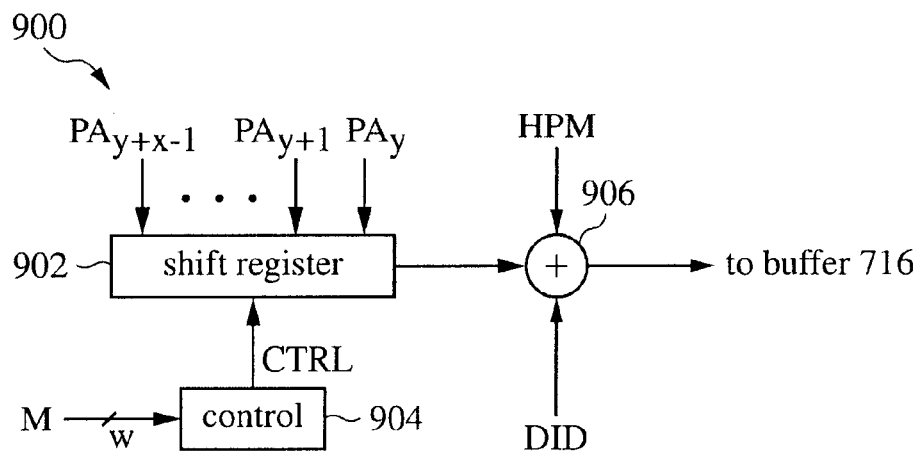
FIG. 10 is a block diagram of a shift register circuit in one embodiment of the CAM device of FIG. 4A.
FIG. 11 is a truth table illustrating logic functions performed by the multiplexer circuit of FIG. 9 and the shift register circuit of FIG. 10.

In other embodiments, concatenation logic 711 of FIG. 8 may be replaced by a shift register circuit 900 shown in FIG. 10. Shift register circuit 900 includes a shift register 902, a control circuit 904, and a concatenation node 906. In some embodiments, concatenation node 906 is included within buffer 716. Shift register 902 is a parallel loadable register having a number of bit locations each coupled to receive a corresponding PA bit. Shift register 902 includes an output terminal coupled to a first input terminal concatenation node 906. Concatenation node 906 includes second and third input terminals to receive the DID and HPM index (e.g., from status register 407 of FIG. 4B), and an output terminal coupled to buffer 716.

In response to the mode signals M, control circuit 904 generates a control signal CTRL that causes shift register 902 to output a corresponding number of the PA bits to concatenation node 906 (depending upon how many CAM devices are cascaded in MCM 100). In one embodiment, CTRL is a clock signal having a number of cycles determined by the M signals. For example, if there are two CAM devices, shift register 902 forwards one PA bit, i.e., PA[y], to node 906, if there are four CAM devices, shift register 902 forwards two of the PA bits, i.e., PA[y+1:y] to node 906, and so on. Concatenation node 906 concatenates the PA bit(s) provided by shift register 902 with the DID and the HPM index to form the device index, which in turn is provided to buffer 716. The truth table of FIG. 11 also summarizes the logic functions performed by shift register circuit 900.

Figure 12:
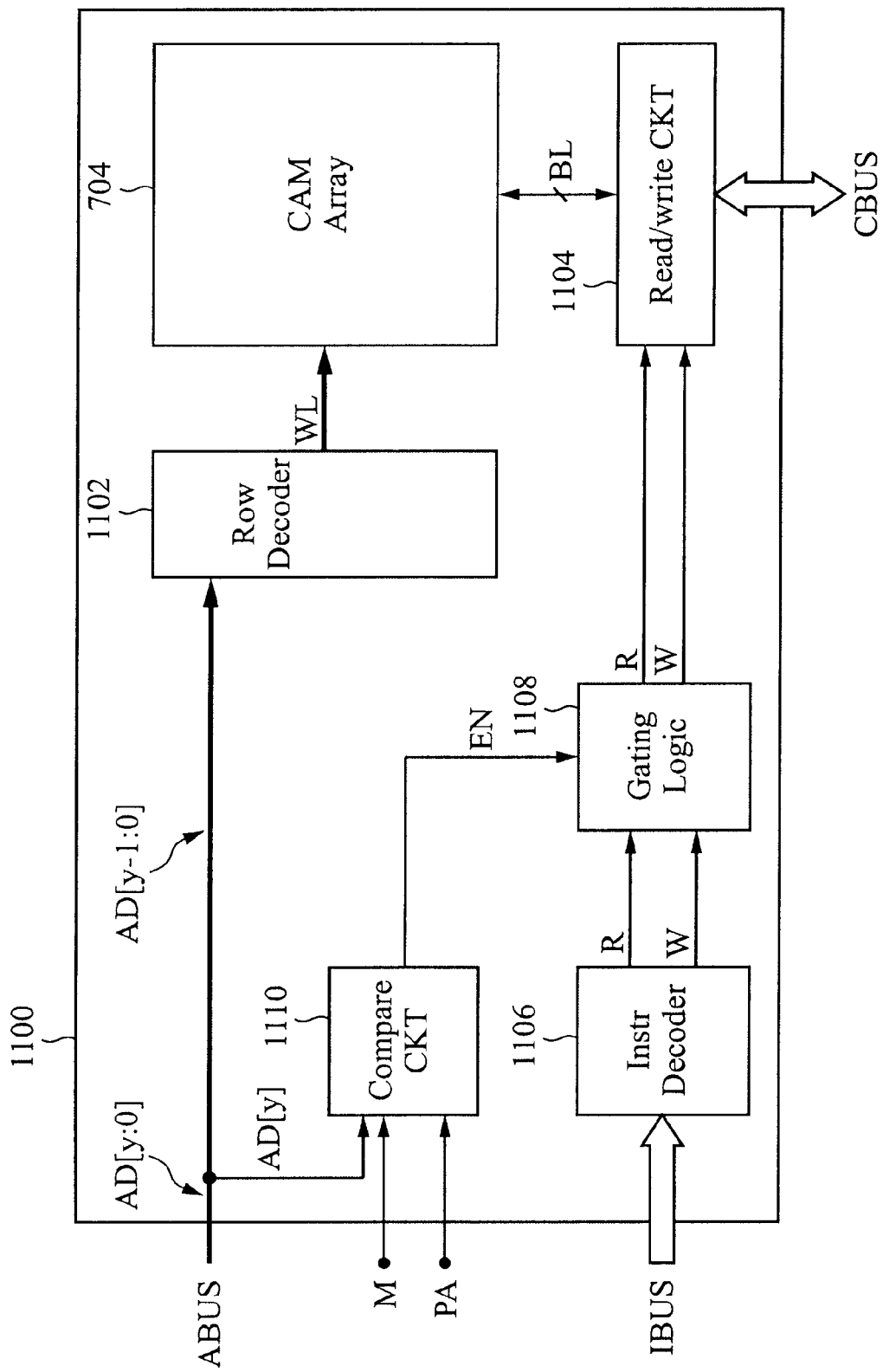
FIG. 12 is a block diagram of another embodiment of the CAM device of FIG. 4A.

Read and write operations to CAM devices 400(0) and 400(1) of MCM package 500 are discussed below with respect to FIG. 12, which shows a portion 1100 in one embodiment of CAM device 400. CAM portion 1100 includes CAM array 704, a row decoder 1102, a read/write circuit 1104, an instruction decoder 1106, gating logic 1108, and a compare circuit 1110. Row decoder 1102 is coupled to each of the plurality of word lines WL of corresponding rows in CAM array 704. Read/write circuit 1104 is coupled to a plurality of bit lines BL of corresponding columns in CAM array 704. Although not shown in FIG. 12, in some embodiments, CAM array 704 includes a pair of complementary bit lines for each column in the array. CAM 1100 may also include the circuitry shown in FIGS. 7A–10.

Referring also to FIGS. 4A and 5, to write data to a specific row within CAM device 400(0) or 400(1) of MCM 500, a write instruction is provided to instruction decoder 1106 of both CAM devices 400(0) and 400(1) via IBUS, and corresponding data is provided to read/write circuit 1104 of both CAM devices 400(0) and 400(1) via CBUS. A y+1 bit address AD[y:0] is provided to both CAM devices 400(0) and 400(1) via an address bus ABUS. In some embodiments, ABUS may be eliminated, and AD[y:0] provided to CAM devices 400(0) and 400(1) using CBUS. Within each CAM device 400, a first portion of the address, AD[y−1:0], is provided to row decoder 1102, and a second portion of the address, AD[y], is provided to compare circuit 1110. In response to the first portion of the address AD[y−1:0], row decoder 1102 selects (e.g., enables) a corresponding word line WL in CAM array 704 for the write operation.

Compare circuit 1110 receives M, AD[y], and the priority address bit PA, and in response to M, selectively compares the second portion of the address AD[y] with the priority address PA bit to generate an enable signal EN that determines whether corresponding CAM device 400 executes the write instruction. If M=1, compare circuit 1110 asserts EN (e.g., to logic "1") if the comparison between AD[y] and PA results in a match. If there is not a match, compare circuit 1110 de-asserts EN (e.g., to logic "0"). Conversely, if M=0, compare circuit 1110 asserts EN, irrespective of the comparison results between AD[y] and PA.

Instruction decoder 1106 decodes the write instruction received from IBUS, and generates one or more write signals W for read/write circuit 1104. Gating logic 1108 selectively forwards W to read/write circuit 1104 in response to EN. For example, if EN is asserted, gating logic 1108 forwards W to read/write circuit 1104, which in response thereto executes the instruction so that data provided from CBUS is written into the row of CAM array 704 selected by row decoder 1102. Conversely, if EN is de-asserted, gating logic 1108 does not forward W to read/write circuit 1104, and data is not written to CAM array 704. In this manner, the priortity address bit PA is used to determine which CAM device 400(0) or 400(1) executes the write instruction.

Data is read from CAM array 704 of CAM device 400(0) or 400(1) in a similar manner. In response to a read instruction provided on IBUS, instruction decoder 1106 generates one or more read signals R for read/write circuit 1104. Row decoder 1102 decodes the first address portion AD[y−1:0] to select a row in CAM array 704, and compare circuit 1110 compares the second address portion AD[y] with the priority address bit PA to generate EN. Thus, if M=1, and if there is a match in compare circuit 1110, EN is asserted, and gating logic 1108 forwards R to read/write circuit 1104, which in turn may output data read from the selected row via bit lines BL onto CBUS. If there is not a match, EN is de-asserted, gating logic 1108 does not forward R to read/write circuit 1104, and thus data is not read from CAM array 704 to CBUS. Of course, if M=0, compare circuit 1110 asserts EN, and the read instruction is executed in the CAM device 400.

Figure 9:
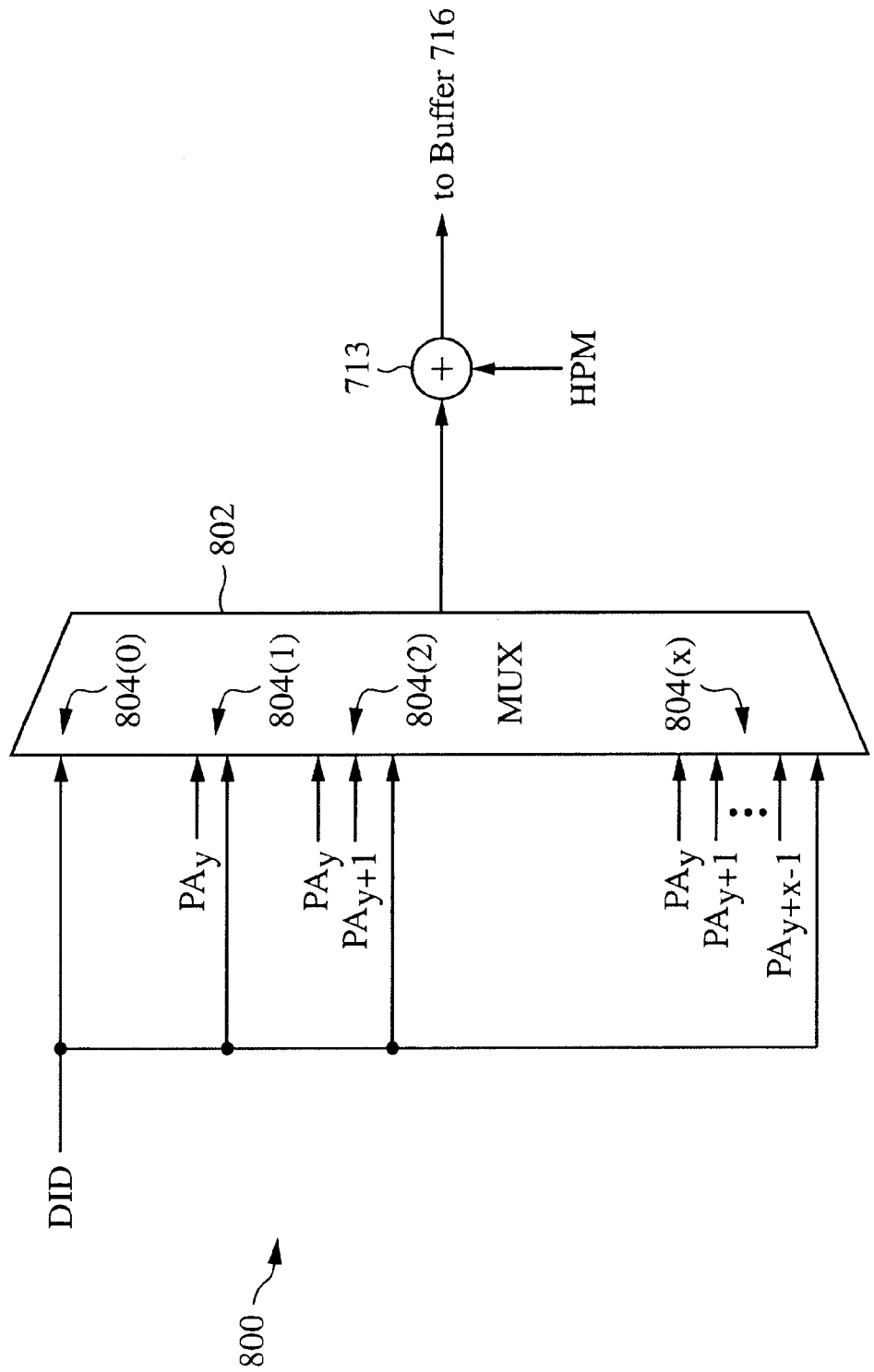
FIG. 9 is a block diagram of a multiplexer circuit used in one embodiment of the CAM device of FIG. 4A.

In embodiments where each CAM device 400 includes more than one priority address bit PA, portion 1100 of CAM device 400 may be modified to accommodate multiple priority address bits PA by performing a comparison between a selected number of the PA bits and corresponding MSBs of the address AD to generate EN. The mode signals M indicate the number of CAM devices cascaded within the MCM package and determine how many of the priority address bits PA participate in the comparison in the compare circuit 1110. For example, in embodiments where each CAM device utilizes x=three PA input bits, and there are n=8 CAM devices within the MCM package, the mode signals are set so that the three PA bits are compared with the three MSBs of the address AD in compare circuit 1110 to generate EN. EN is asserted only if all such address bit comparisons match. The remaining bits of AD are provided to row decoder 1102 to select a row of CAM array 704. Similar multiplexing schemes or shift register schemes as shown in FIGS. 9 and 10 can be used to select the MSBs of AD to compare with the PA inputs in response to the M signals.

As described above, the mode signal M and priority address bit(s) PA of CAM devices 400(0) and 400(1) of MCM 500 may be generated within the MCM package by hardwiring corresponding input pads of CAM devices 400 (0) and 400(1) to logic states provided within the MCM package, and thus do not require external signal inputs. In this manner, the mode signal and priority address bits, as well as the various logic functions performed using these signals, are transparent to users or systems employing the MCM package, thereby allowing the MCM package to not only appear as a CAM package having a single CAM die but also effectively operate as one. The ability to operate as a single CAM package allows present embodiments to compete with next generation CAM devices. Further, because MCM packages of the present invention may be fabricated using current process technologies and proven CAM array architectures, as described above, they may be ready for commercial use long before the next generation process technology is perfected, thereby providing a distinct competitive advantage.

In addition, in some embodiments, MCM package 500 is one embodiment of package 501 of FIGS. 6A and 6B, and thus the above description of package 501 is equally applicable to the various embodiments of MCM package 500.

Figures 13A, 13B, 13C:
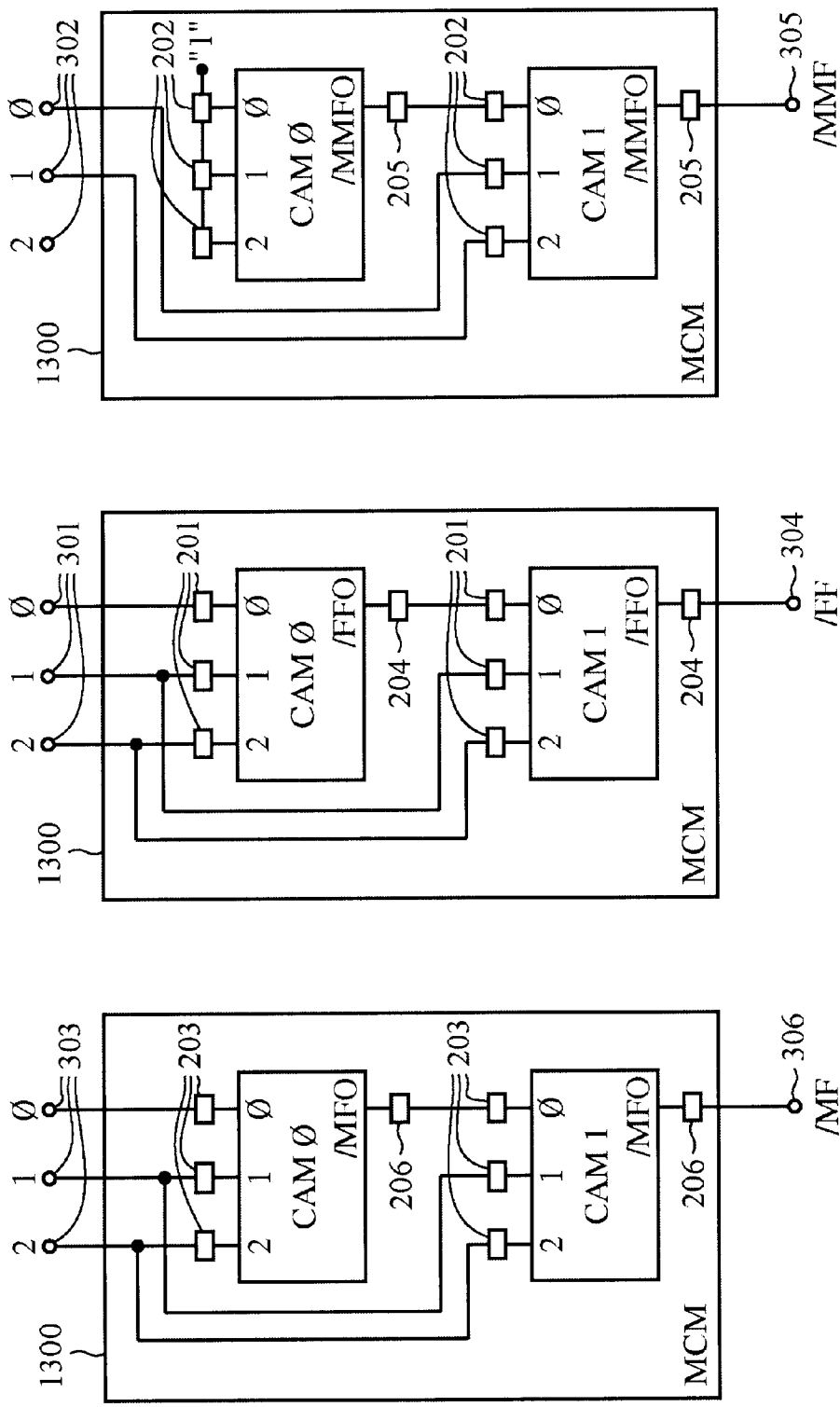
FIG. 13A illustrates match flag cascade connections between two CAM devices of FIG. 2A in one embodiment of the MCM of FIG. 1.
FIG. 13B illustrates full flag cascade connections between two CAM devices of FIG. 2A in one embodiment of the MCM of FIG. 1.
FIG. 13C illustrates multiple match flag cascade connections between two CAM devices of FIG. 2A in one embodiment of the MCM of FIG. 1.

Although described above as having only one match flag, multiple match flag, and full flag inputs, in other embodiments, the CAM devices discussed above may include a plurality of such inputs. In one embodiment, CAM devices employed in MCMs described above may each include three match flag inputs /MFI, three full flag inputs /FFI, and three multiple match flag inputs /MMFI. FIGS. 13A–13C illustrate corresponding routing interconnections between two such CAM devices in an MCM 1300 that is one embodiment of MCM 100 of FIG. 1. FIG. 13A illustrates routing connections for match flag signals, FIG. 13B illustrates routing connections for full flag signals, and FIG. 13C illustrates routing connections for multiple match signals. In the embodiment shown in FIGS. 13A–13C, the CAM devices within each MCM 1300 may be CAM device 200, CAM device 400, or any other CAM device, and each includes three pads 203 to receive three /MFI inputs from three corresponding balls 303 of MCM 1300, three pads 201 to receive three /FFI inputs from three corresponding balls 301 of MCM 300, and three pads 202 to receive three /MMFI inputs from three corresponding balls 302 of MCM 1200.

Figure 14:
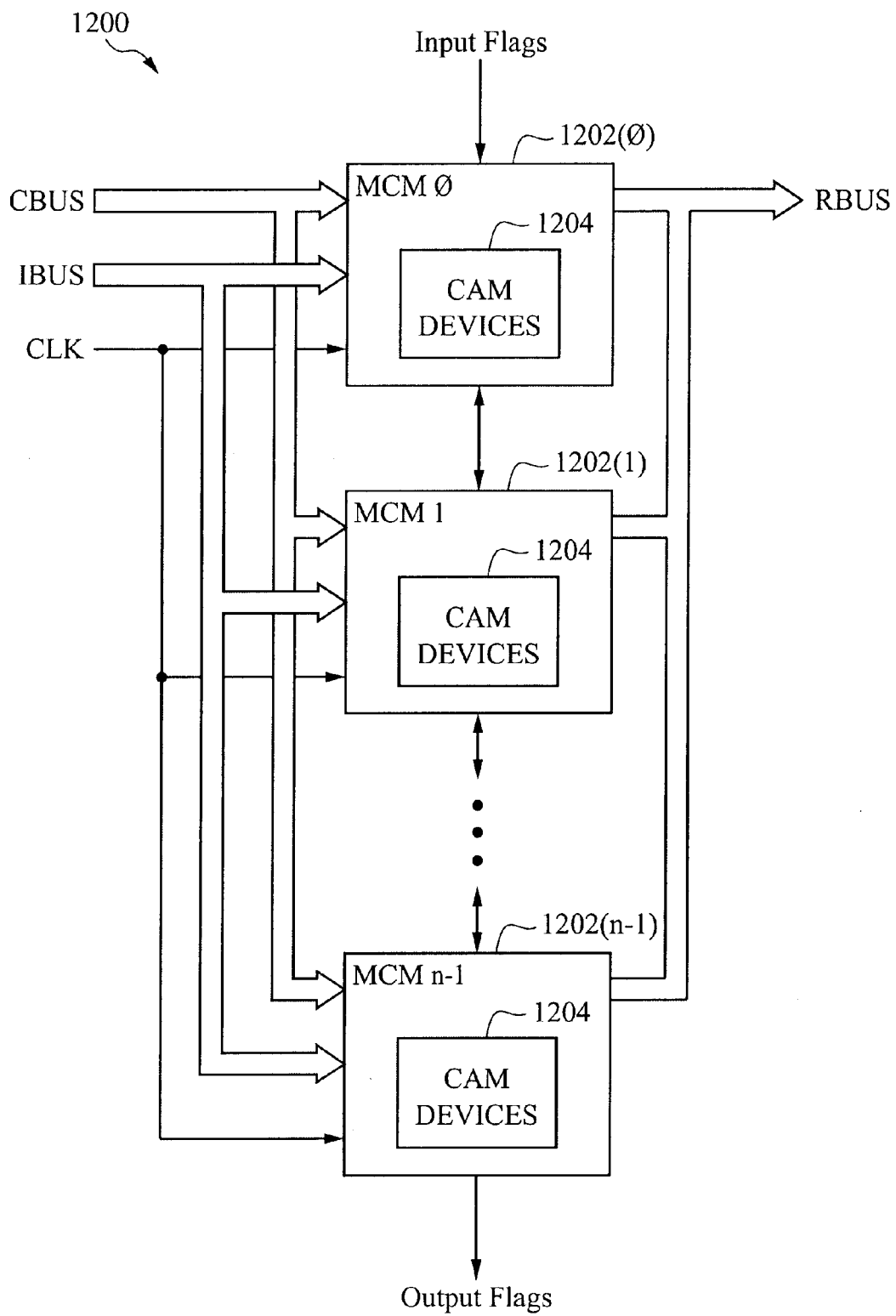
FIG. 14 is a block diagram of a system having a plurality of the MCM devices of FIG. 1.

FIG. 14 shows a system 1200 having a plurality of cascaded MCM packages 1202(0)–1202(n−1). Each MCM package 1202(0)–1202(n−1) is coupled to CBUS, IBUS, RBUS, and CLK, and may receive one or more input flags such as, for example, match flag(s), multiple match flag(s), and full flag(s). Each MCM 1202 may include any number of CAM devices 1204, and operates as described above with respect to FIGS. 1–11. In some embodiments, CAM devices 1204 are CAM devices 200 of FIG. 2A, while in other embodiments CAM devices 1204 are CAM devices 400 of FIG. 4A.

The total memory capability of system 1200 is equal to the sum of the array sizes of CAM devices 1204 in each of MCM packages 1202(0)–1202(n−1). For one embodiment, the first MCM 1202(0) is designated as the highest priority device, the second MCM 1202(1) is designated as the next highest priority device, and so on, where the last MCM 1202(n−1) is designated as the lowest priority device, although in other embodiments priority may be reversed. Specific cascade interconnections between the MCM packages 1202(0)–1202(n−1) may differ between the various embodiments, and are therefore not shown in FIG. 1. Indeed, any suitable cascade interconnect architecture may be used to depth cascade CAM devices 1202(0)–1202(n−1).

Figure 15A:
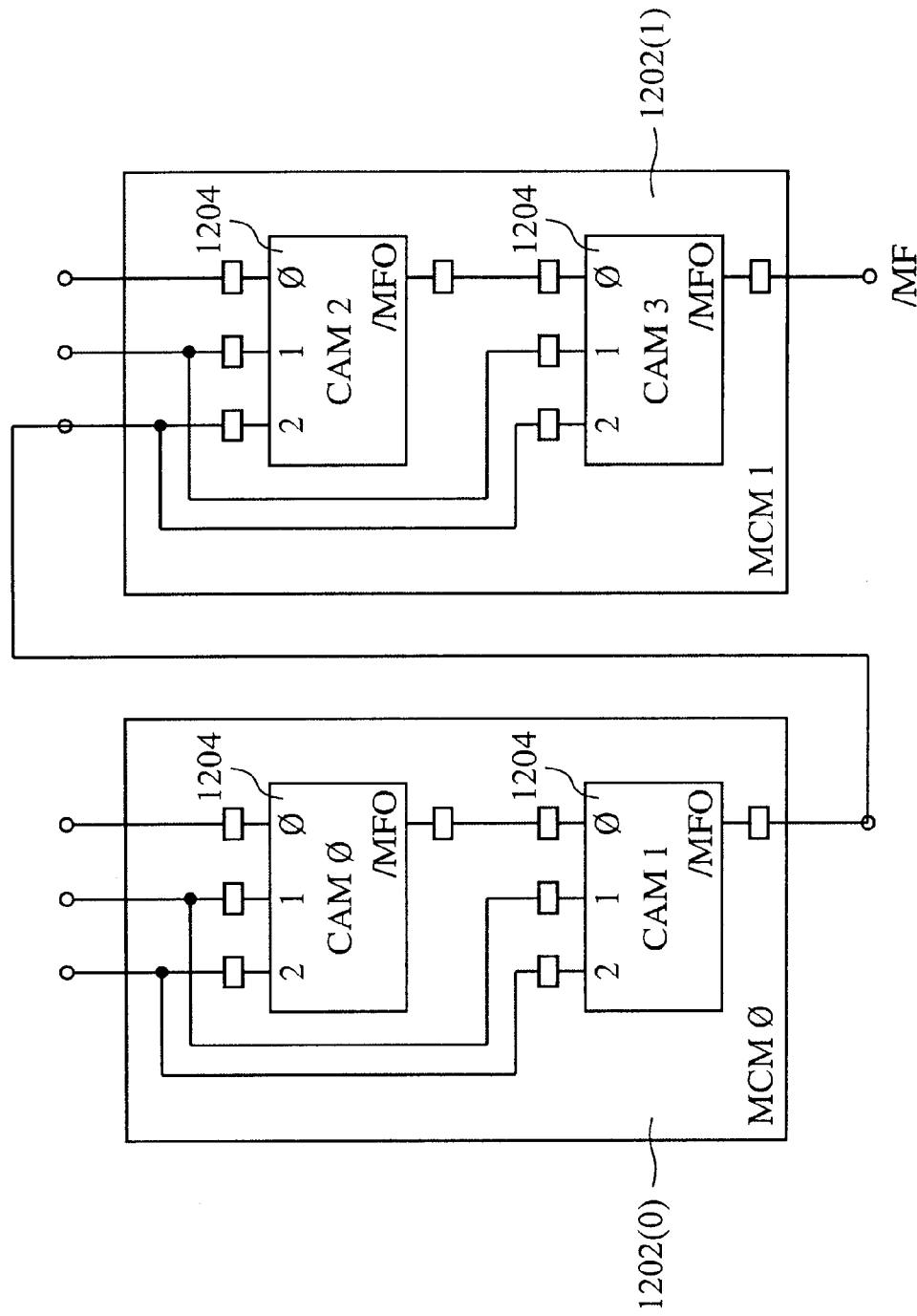
FIG. 15A illustrates match flag cascade connections between two MCM devices in one embodiment of the system of FIG. 14.
Figure 15B:
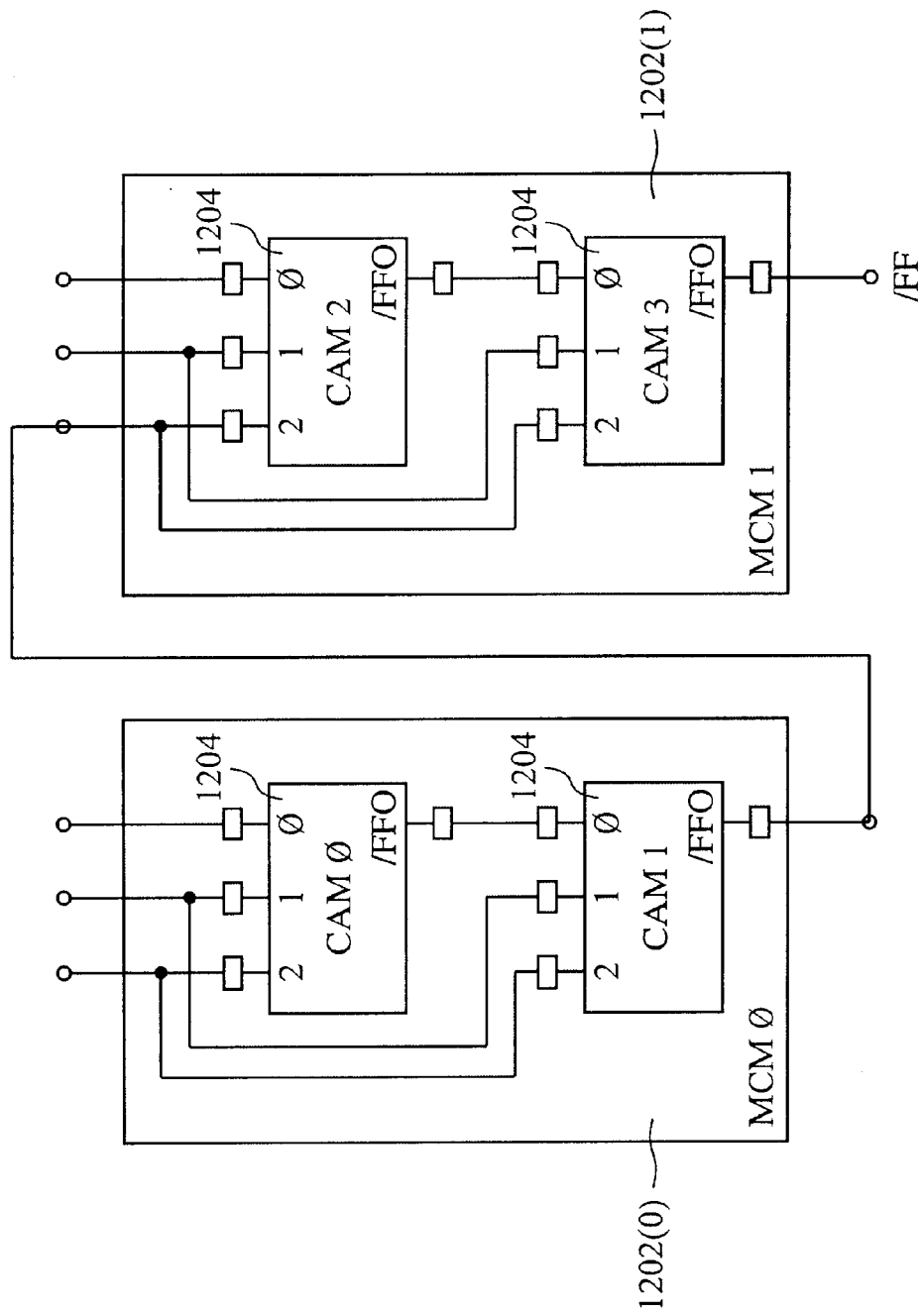
FIG. 15B illustrates full flag cascade connections between two MCM devices in one embodiment of the system of FIG. 14.
Figure 15C:
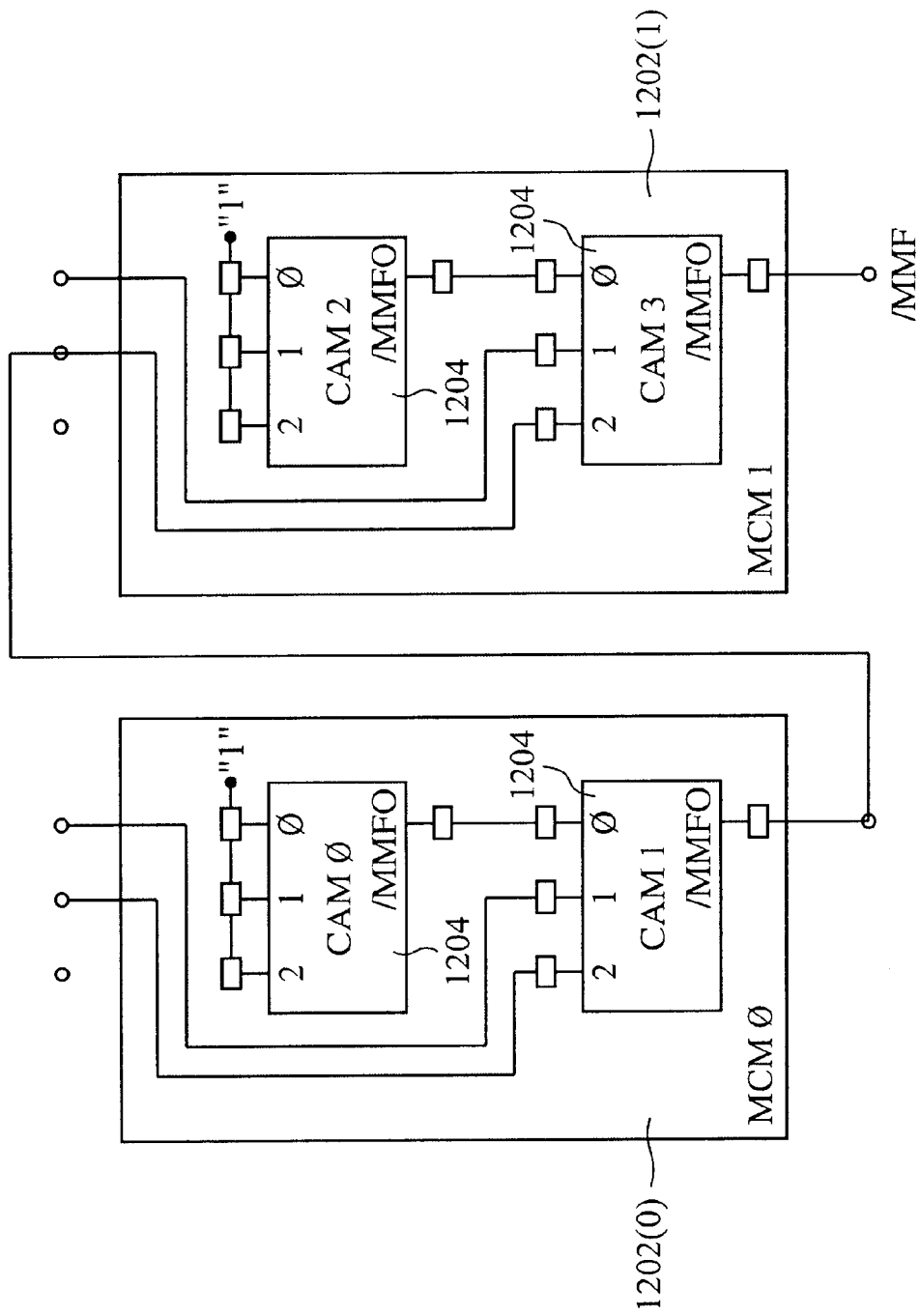
FIG. 15C illustrates multiple match flag cascade connections between two MCM devices in one embodiment of the system of FIG. 14.

Referring to FIGS. 15A–15C, in one embodiment, system 1200 includes two cascaded MCM devices 1202(0) and 1202(1), each having three match flag inputs, three full flag inputs, and multiple match inputs. Each MCM device 1202 (0) and 1202(1) includes two CAM devices 1204, each having three match flag inputs, three full flag inputs, and three multiple match inputs. FIG. 15A illustrates match flag cascade connections between MCMs 1202(0) and 1202(1), where the lower priority MCM 1202(1) provides the match flag /MF for the system. FIG. 15B illustrates full flag cascade connections between MCMs 1202(0) and 1202(1), where the lower priority MCM 1202(1) provides the full flag /FF for the system. FIG. 15C illustrates multiple match flag cascade connections between MCMs 1202(0) and 1202(1), where the lower priority MCM 1202(1) provides the multiple match flag /MMF for the system.

Figure 16A:
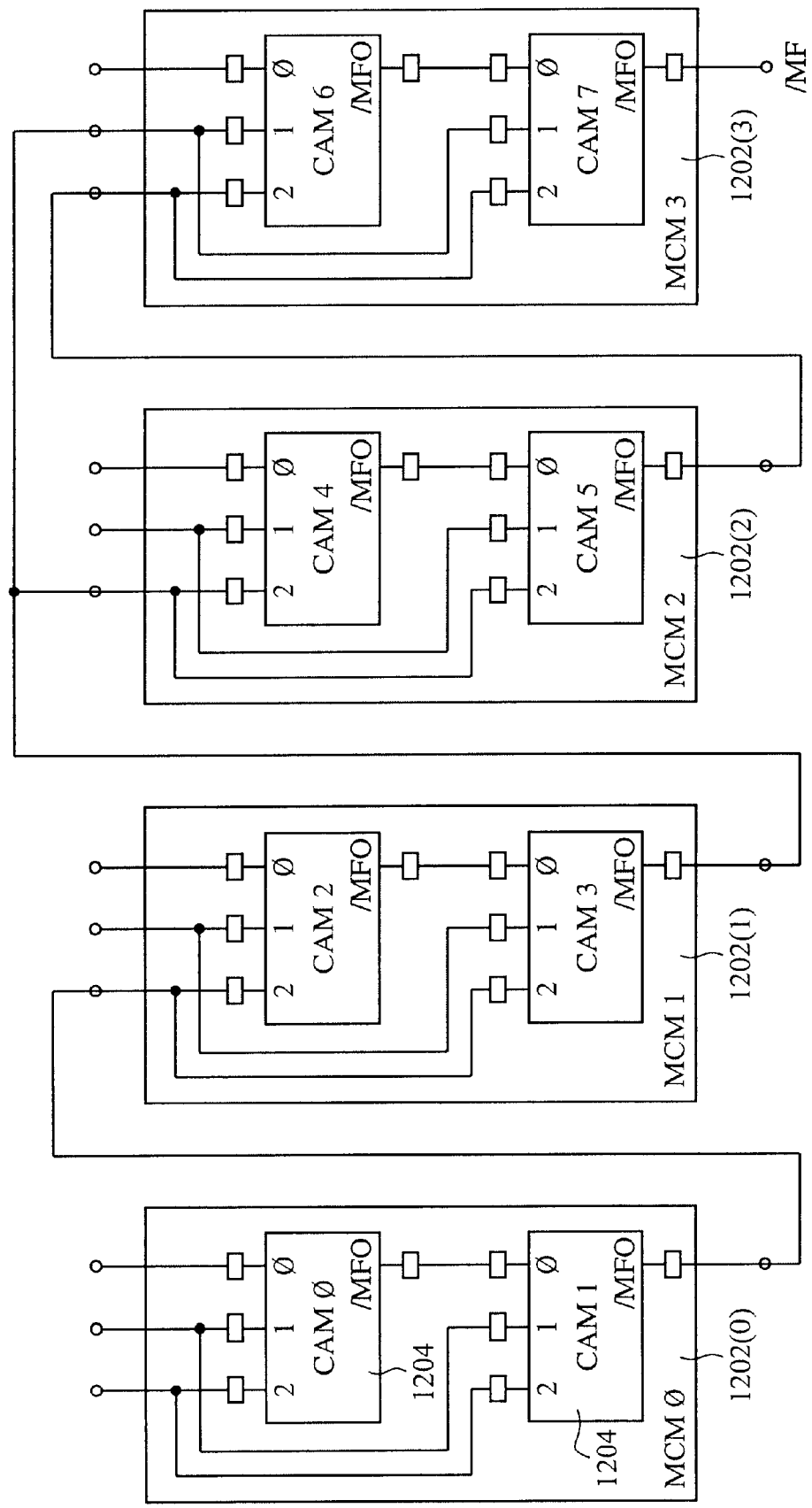
FIG. 16A illustrates match flag cascade connections between four MCM devices in one embodiment of the system of FIG. 14.
Figure 16B:
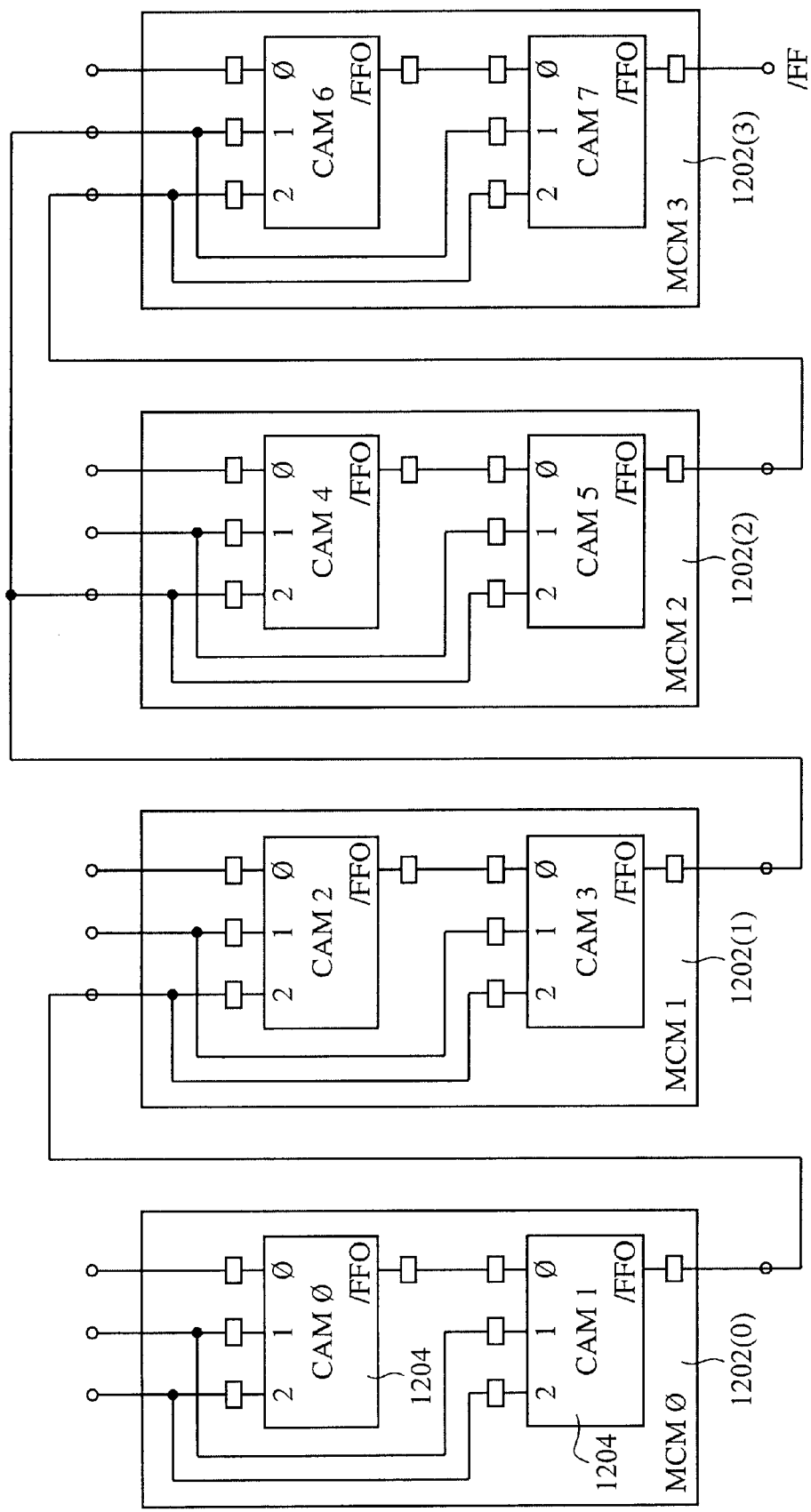
FIG. 16B illustrates full flag cascade connections between four MCM devices in one embodiment of the system of FIG. 14.
Figure 16C:
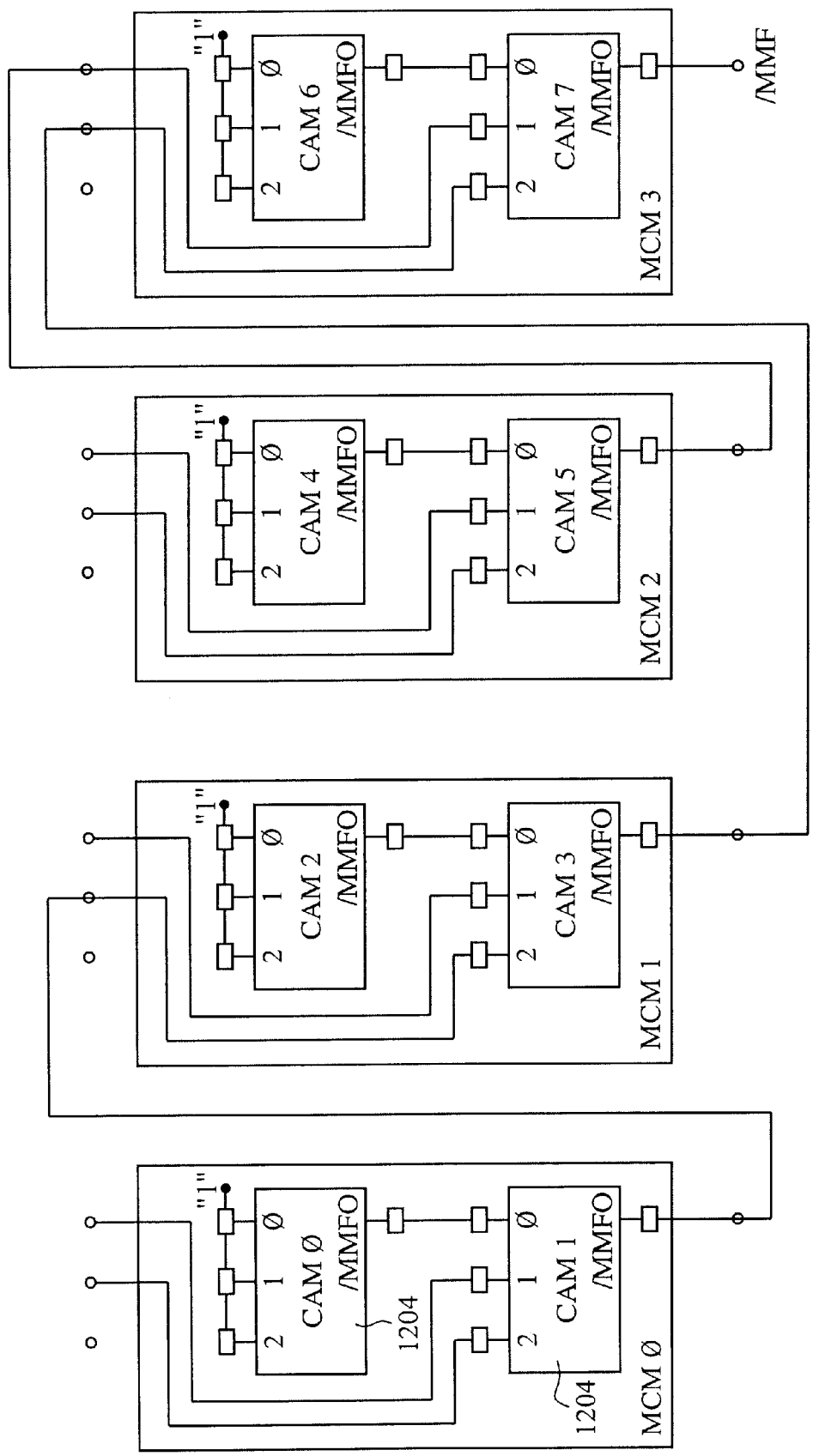
FIG. 16C illustrates multiple match flag cascade connections between four MCM devices in one embodiment of the system of FIG. 14.

Referring to FIGS. 16A–16C, in another embodiment, system 1200 includes four cascaded MCM devices 1202(0)– 1202(3), each having three match flag inputs, three full flag inputs, and three multiple match inputs. Each MCM device 1202(0)–1202(3) includes two CAM devices 1204, each having three match flag inputs, three full flag inputs, and three multiple match inputs. FIG. 16A illustrates match flag cascade connections between four MCMs 1202(0)–1202(3), where the lowest priority MCM 1202(3) provides the match flag /MF for the system. FIG. 16B illustrates full flag cascade connections between MCMs 1202(0)–1202(3), where the lowest priority MCM 1202(3) provides the full flag /FF for the system. FIG. 16C illustrates multiple match flag cascade connections between MCMs 1202(0)–1202(3), where the lowest priority MCM 1202(3) provides the multiple match flag /MMF for the system.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention. Specifically, the respective logic structures of the match logic circuits, the multiple match logic circuits, the priority encoders, and the select circuits described herein may be modified as desired without departing from the scope of the invention. Further, although described above in the context of a monolithic MCM package having a number of CAM dice cascaded therein, the assignment of a single DID to multiple CAM devices in accordance with present embodiments may be used to transparently cascade CAM devices in any CAM system, not just CAM devices within an MCM.

What is claimed is:

1. A monolithic multi-chip module (MCM) package comprising:
   a substrate having an interconnect structure;
   a first content addressable memory (CAM) device attached to the substrate and coupled to the interconnect structure; and
   a second CAM device attached to the substrate and coupled to the interconnect structure, wherein the first and second CAM devices are coupled in a depth cascade configuration.

2. The MCM package of claim 1, wherein the substrate comprises a printed circuit board and the interconnect structure comprises conductive traces.

3. The MCM package of claim 1, further comprising a plastic housing that encapsulates the first and second CAM devices on the substrate.

4. The MCM package of claim 1, further comprising a ceramic housing that encapsulates the first and second CAM devices on the substrate.

5. The MCM package of claim 1, further comprising a plurality of conductive leads attached to the substrate and coupled to the interconnect structure.

6. The MCM package of claim 5, wherein the conductive leads comprise balls arranged as a ball grid array (BGA).

7. The MCM package of claim 5, wherein the conductive leads comprise pins arranged as a pin grid array (PGA).

8. The MCM package of claim 5, wherein the conductive leads have a footprint that is the same as a footprint for another integrated circuit package including the first CAM device but not the second CAM device.

9. The MCM package of claim 5, wherein each CAM device includes a first pad to receive a flag input signal, and at least one of the conductive leads is coupled to a corresponding first pad of at least one of the CAM devices.

10. The MCM package of claim 9, wherein the flag input signal comprises a match flag.

11. The MCM package of claim 9, wherein the flag input signal comprises a full flag.

12. The MCM package of claim 9, wherein the flag input signal comprises a multiple match flag.

13. The MCM package of claim 9, wherein each CAM device includes a second pad to provide a flag output signal, and at least one of the conductive leads is coupled to a corresponding second pad of one of the CAM devices.

14. The MCM package of claim 13, wherein the flag output signal comprises a match flag.

15. The MCM package of claim 13, wherein the flag output signal comprises a full flag.

16. The MCM package of claim 13, wherein the flag output signal comprises a multiple match flag.

17. The MCM package of claim 1, wherein each CAM device includes a mode input for receiving a mode signal indicating whether the CAM device is configured to operate as part of the MCM package.

18. The MCM package of claim 1, wherein the first CAM device has a storage element for storing a first device identification number (DID), and the second CAM device has a storage element to store a second DID.

19. A monolithic content addressable memory (CAM) package, comprising:
   a substrate having an interconnect structure;
   a plurality of CAM dice attached to the substrate and coupled to each other through the interconnect structure in a cascade configuration; and
   a plurality of conductive leads attached to the substrate and coupled to the CAM dice by the interconnection structure.

20. The CAM package of claim 19, further comprising a protective insulating layer encapsulating the CAM dice to the substrate.

21. The CAM package of claim 20, wherein the protective insulating layer comprises ceramic.

22. The CAM package of claim 20, wherein the protective insulating layer comprises plastic.

23. The MCM package of claim 19, wherein the substrate comprises a printed circuit board and the interconnect structure comprises conductive traces.

24. The MCM package of claim 19, wherein the conductive leads comprise balls arranged as a ball grid array (BGA).

25. The MCM package of claim 19, wherein the conductive leads comprise pins arranged as a pin grid array (PGA).

26. The MCM package of claim 19, wherein the conductive leads have a footprint that is the same as a footprint for another integrated circuit package including only one of the CAM devices.

27. The MCM package of claim 19, wherein each CAM device includes a first pad to receive a flag input signal, and at least one of the conductive leads is coupled to a corresponding first pad of at least one of the CAM devices.

28. The MCM package of claim 27, wherein the flag input signal comprises a match flag.

29. The MCM package of claim 27, wherein the flag input signal comprises a full flag.

30. The MCM package of claim 27, wherein the flag input signal comprises a multiple match flag.

31. The MCM package of claim 19, wherein each CAM device includes a second pad to provide a flag output signal, and at least one of the conductive leads is coupled to a corresponding second pad of one of the CAM devices.

32. The MCM package of claim 31, wherein the flag output signal comprises a match flag.

33. The MCM package of claim 31, wherein the flag output signal comprises a full flag.

34. The MCM package of claim 31, wherein the flag output signal comprises a multiple match flag.

35. The MCM package of claim 19, wherein each CAM device includes a mode input for receiving a mode signal indicating whether the CAM device is configured to operate as part of the MCM package.

36. A content addressable memory (CAM) system, comprising:
   a first monolithic multi-chip module (MCM) package housing a first plurality of CAM dice; and
   a second MCM package housing a second plurality of CAM dice, wherein the first and second pluralities of CAM dice are coupled in a depth cascade configuration.

37. The CAM system of claim 36, wherein the first and second MCM packages each comprise:
   a substrate having an interconnect structure, the CAM dice attached to the substrate and electrically coupled to the interconnect structure;
   a plurality of conductive leads attached to the substrate and electrically coupled to the interconnect structure; and
   a protective insulating layer encapsulating the CAM dice and the substrate.

38. The CAM system of claim 37, further comprising a cascade interconnect architecture electrically coupled to one or more of the conductive leads of the first and second MCM packages to route one or more signals therebetween.

39. The CAM system of claim 37, wherein the substrate comprises a printed circuit board and the interconnect structure comprises conductive traces.

40. The CAM system of claim 37, wherein the conductive leads comprise balls arranged as a ball grid array (BGA).

41. The CAM system of claim 37, wherein the conductive leads comprise pins arranged as a pin grid array (PGA).

42. The CAM system of claim 37, wherein the conductive leads have a footprint that is the same as a footprint for another integrated circuit package that includes only one CAM die.

43. The CAM system of claim 37, wherein at least one of the conductive leads is for receiving a flag signal.

44. The CAM system of claim 43, wherein the flag signal comprises a match flag.

45. The CAM system of claim 43, wherein the flag signal comprises a full flag.

46. The CAM system of claim 43, wherein the flag signal comprises a multiple match flag.

47. A monolithic multi-chip module (MCM) package comprising:
   a substrate having an interconnect structure;
   a first content addressable memory (CAM) device attached to the substrate and coupled to the interconnect structure;
   a second CAM device attached to the substrate and coupled to the interconnect structure; and
   a plurality of conductive leads attached to the substrate and coupled to the interconnect structure, wherein the conductive leads have a footprint that is the same as a footprint for another integrated circuit package including the first CAM device but not the second CAM device.

48. The MCM package of claim 47, wherein each CAM device includes a first pad to receive a flag input signal, and at least one of the conductive leads is coupled to a corresponding first pad of at least one of the CAM devices.

49. The MCM package of claim 48, wherein the flag input signal comprises a match flag.

50. The MCM package of claim 48, wherein the flag input signal comprises a full flag.

51. The MCM package of claim 48, wherein the flag input signal comprises a multiple match flag.

52. The MCM package of claim 48, wherein each CAM device includes a second pad to provide a flag output signal, and at least one of the conductive leads is coupled to a corresponding second pad of one of the CAM devices.

53. The MCM package of claim 52, wherein the flag output signal comprises a match flag.

54. The MCM package of claim 52, wherein the flag output signal comprises a full flag.

55. The MCM package of claim 52, wherein the flag output signal comprises a multiple match flag.

56. The MCM package of claim 47, wherein each CAM device includes a mode input for receiving a mode signal indicating whether the CAM device is configured to operate as part of the MCM package.

57. The MCM package of claim 47, wherein the first CAM device has a storage element for storing a first device identification number (DID), and the second CAM device has a storage element to store a second DID.

58. A monolithic multi-chip module (MCM) package comprising:
   a substrate having an interconnect structure;
   a first content addressable memory (CAM) device attached to the substrate and coupled to the interconnect structure;
   a second CAM device attached to the substrate and coupled to the interconnect structure; and
   a plurality of conductive leads attached to the substrate and coupled to the interconnect structure, wherein each CAM device includes a first pad to receive a flag input signal, and at least one of the conductive leads is coupled to a corresponding first pad of at least one of the CAM devices.

59. The MCM package of claim 58, wherein the flag input signal comprises a match flag.

60. The MCM package of claim 58, wherein the flag input signal comprises a full flag.

61. The MCM package of claim 58, wherein the flag input signal comprises a multiple match flag.

62. The MCM package of claim 58, wherein each CAM device includes a second pad to provide a flag output signal, and at least one of the conductive leads is coupled to a corresponding second pad of one of the CAM devices.

63. The MCM package of claim 62, wherein the flag output signal comprises a match flag.

64. The MCM package of claim 62, wherein the flag output signal comprises a full flag.

65. The MCM package of claim 62, wherein the flag output signal comprises a multiple match flag.

66. The MCM package of claim 58, wherein each CAM device includes a mode input for receiving a mode signal indicating whether the CAM device is configured to operate as part of the MCM package.

67. The MCM package of claim 58, wherein the first CAM device has a storage element for storing a first device identification number (DID), and the second CAM device has a storage element to store a second DID.

68. A monolithic multi-chip module (MCM) package comprising:
   a substrate having an interconnect structure;
   a first content addressable memory (CAM) device attached to the substrate and coupled to the interconnect structure; and
   a second CAM device attached to the substrate and coupled to the interconnect structure, wherein each CAM device includes a mode input for receiving a mode signal indicating whether the CAM device is configured to operate as part of the MCM package.

69. The MCM package of claim 68, wherein the first CAM device has a storage element for storing a first device identification number (DID), and the second CAM device has a storage element to store a second DID.

70. A monolithic multi-chip module (MCM) package comprising:

a substrate having an interconnect structure;

a first content addressable memory (CAM) device attached to the substrate and coupled to the interconnect structure; and a second CAM device attached to the substrate and coupled to the interconnect structure, wherein the first CAM device has a storage element for storing a first device identification number (DID), and the second CAM device has a storage element to store a second DID.

\* \* \* \* \*